United States Patent [19]
Takeuchi et al.

[11] Patent Number: 6,157,056
[45] Date of Patent: Dec. 5, 2000

[54] SEMICONDUCTOR MEMORY DEVICE HAVING A PLURALITY OF MEMORY CELL TRANSISTORS ARRANGED TO CONSTITUTE MEMORY CELL ARRAYS

[75] Inventors: Yuji Takeuchi, Kawasaki; Toshiharu Watanabe, Yokohama; Seiichi Aritome, Yokohama; Hiroshi Watanabe, Yokohama; Kazuhiro Shimizu, Yokohama, all of Japan

[73] Assignee: Kabushiki Kaisha Toshiba, Kawasaki, Japan

[21] Appl. No.: 09/008,627

[22] Filed: Jan. 16, 1998

[30] Foreign Application Priority Data

Jan. 20, 1997 [JP] Japan ................................. 9-007262

[51] Int. Cl.[7] ....................... H01L 29/708; H01L 21/336; G11C 16/04
[52] U.S. Cl. ....................... 257/315; 365/185.17; 438/258
[58] Field of Search ....................... 257/315; 365/185.17; 438/258

[56] References Cited

U.S. PATENT DOCUMENTS

| 5,031,011 | 7/1991 | Aritome et al. | 257/319 |
| 5,554,867 | 9/1996 | Ajika et al. | 257/314 |
| 5,568,421 | 10/1996 | Aritome | 365/185.17 |
| 5,680,347 | 10/1997 | Takeuchi et al. | 365/185.7 |
| 5,682,350 | 10/1997 | Lee et al. | 365/185.17 |
| 5,698,879 | 12/1997 | Aritome et al. | 257/315 |

FOREIGN PATENT DOCUMENTS

| 3-283662 | 12/1991 | Japan . |
| 5-3326 | 1/1993 | Japan . |
| 7-202143 | 8/1995 | Japan . |

*Primary Examiner*—Olik Chaudhuri
*Assistant Examiner*—Howard Weiss
*Attorney, Agent, or Firm*—Banner & Witcoff, Ltd.

[57] ABSTRACT

The semiconductor memory device comprises first and second memory cell rows each constructed by connecting a plurality of memory cell transistors, and third and fourth memory cell rows which are provided to be respectively adjacent to the first and second memory cell rows, such that element separation regions are respectively provided between adjacent memory cell rows. First and second transistors are connected between a drain or a source of the first memory cell row and a drain or a source of the second memory cell row. Gate electrodes of the first and third transistors are connected by a first gate line, and gate electrodes of the second and fourth transistors are connected by a second gate line. The first and second transistors are connected to a data line by a first contact. The third and fourth transistors are connected to a data line by a second contact. A first spacing element is connected between the first and second transistors and a second spacing element is connected between the third and fourth transistors, so that the distance between the first and second contacts is widened. The first contact is provided between the first transistor and the first spacing element. The second contact is provided between the fourth transistor and the second spacing element. The first spacing element is connected through the third gate line to the second spacing element.

20 Claims, 31 Drawing Sheets

|  | BATCH-ERASURE | SELECTIVE WRITING | SELECTIVE READING |
|---|---|---|---|
| DL1 | FLOATING | 0 | Vcc |
| DL2 | FLOATING | Vm | 0 |
| DL3 | FLOATING | Vm | 0 |
| SL | FLOATING | 0 | 0 |
| SGD1 | Vppe | Vm | Vcc |
| SGD2 | Vppe | 0 | 0 |
| SGS1 | Vppe | 0 | Vcc |
| SGS2 | Vppe | 0 | 0 |
| CG1 | 0 | Vm | Vcc |
| CG2 | 0 | Vppw | 0 |
| CG3 | Vppe | 0 | 0 |
| CG4 | Vppe | 0 | 0 |
| p-WELL | Vppe | 0 | 0 |
| n-SUBSTRATE | Vppe | 0 | 0 |

FIG. 18

|  | BATCH-ERASURE | SELECTIVE WRITING | SELECTIVE READING |
|---|---|---|---|
| DL1 | FLOATING | 0 | Vcc |
| DL2 | FLOATING | Vm | 0 |
| DL3 | FLOATING | Vm | 0 |
| SL | FLOATING | 0 | 0 |
| SGD1 | Vppe | 0 | 0 |
| CG1 | 0 | Vm | Vcc |
| CG2 | 0 | Vppw | 0 |
| CG3 | 0 | Vm | Vcc |
| CG4 | 0 | Vm | Vcc |
| SGS1 | Vppe | 0 | Vcc |
| SGS2 | Vppe | 0 | 0 |
| p-WELL | Vppe | 0 | 0 |
| n-SUBSTRATE | Vppe | 0 | 0 |

FIG. 39

|  | BATCH-ERASURE | SELECTIVE WRITING | SELECTIVE READING |
|---|---|---|---|
| DL1 | 0V | 5V | 3V |
| DL2 | 0V | 0V | 0V |
| SL | 0V | 0V | 0V |
| SGD1 | 0V | 0V | 0V |
| SGD2 | 15V (OR 3V) | 5V | 3V |
| SGS1 | 15V (OR 3V) | 0V | 0V |
| SGS2 | 15V (OR 3V) | 5V | 3V |
| CG1 | 0V | 0V | 0V |
| CG2 | 0V | 0V | 0V |
| CG3 | 15V | 0V | 0V |
| CG4 | 15V | −10V | 3V |
| CG5 | 15V | 0V | 0V |
| CG6 | 15V | 0V | 0V |
| p-WELL | 0V | 0V | 0V |
| n-SUBSTRATE | 0V | 0V | 0V |

FIG. 45

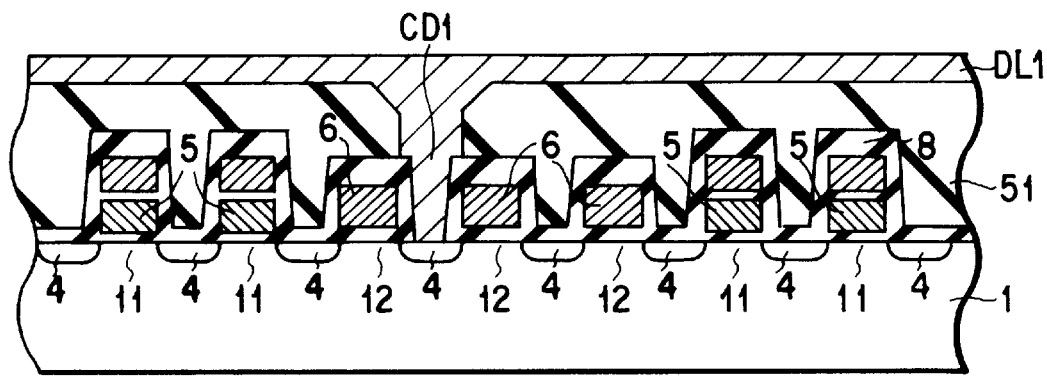
F I G. 47
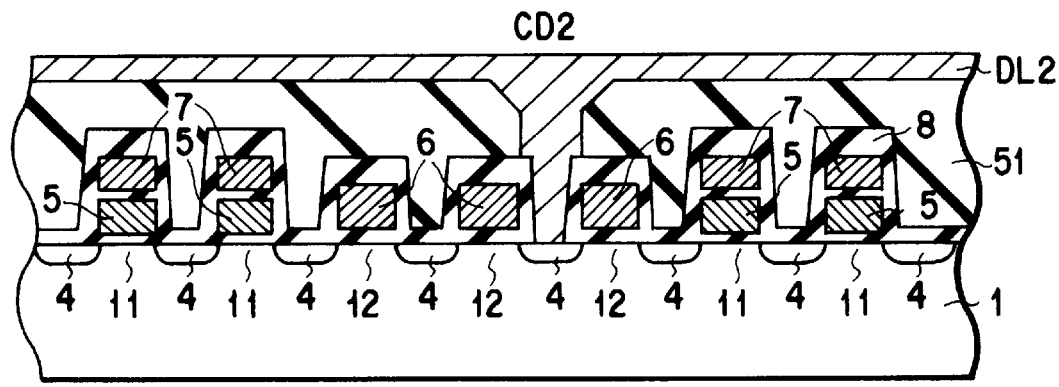
F I G. 48
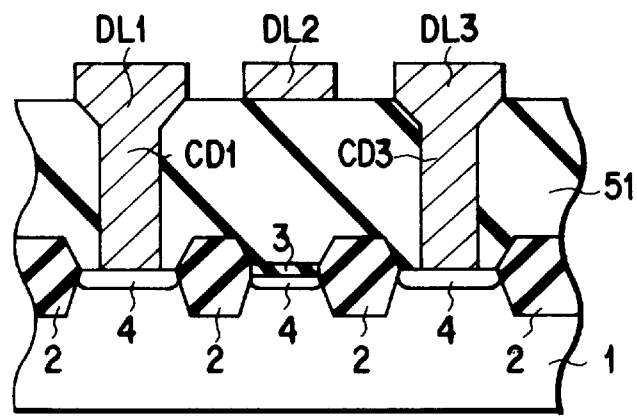
F I G. 49

SEMICONDUCTOR MEMORY DEVICE HAVING A PLURALITY OF MEMORY CELL TRANSISTORS ARRANGED TO CONSTITUTE MEMORY CELL ARRAYS

BACKGROUND OF THE INVENTION

The present invention relates to a non-volatile semiconductor memory device having a MOS structure using a memory cell having a charge storage layer such as a floating gate or the like, and a control gate, and particularly, to a semiconductor memory device in which the distance between adjacent data line contacts each other is widened so that error operations can be avoided.

Conventionally, in the field of non-volatile semiconductor memory devices, an electrically re-writable non-volatile semiconductor memory device is known as an EEPROM.

This kind of EEPROM has a memory cell array in which memory cell transistors are arranged at cross points where line wires and row wires cross each other. A memory cell transistor normally has a MOS structure in which a floating gate and a control gate are layered on each other.

Among EEPROMs, a NAND type EEPROM is known as a method suitable for high integration.

FIG. 1 is a plan view showing an example of a conventional NAND type EEPROM. FIG. 2 is a cross-section cut along a line II—II in FIG. 1. FIG. 3 is a cross-section cut along a line III—III in FIG. 1. FIG. 4 is a cross-section cut along a line IV—IV in FIG. 1. In addition, FIG. 5 shows an equivalent circuit of FIG. 1.

In an NAND type EEPROM, a plurality of memory cell transistors 11 are connected in series to form a unit NAND cell. As shown in FIGS. 1 to 5, the drain side of a NAND cell is connected to data lines DL1, DL2, and DL3 through a transistor 12, while the source side of the NAND cell is connected to a source line SL through a transistor 12.

Normally, data line DL1, DL2, and DL3 are made of a semiconductor including metal or impurities at a high density, on an inter-layer insulating film 51 covering a memory cell transistor 11, and are connected to the transistor 12 in the drain side of the NAND cell.

By thus providing a plurality of NAND cells, a memory cell array is constructed. In the figures, reference 1 denotes a semiconductor substrate, and reference 2 denotes an element separation region. Reference 3 denotes a gate insulating film, and reference 4 denotes a source-drain diffusion layer. Reference 5 denotes a floating gate. Reference 6 denotes a selection gate. Reference 7 denotes a control gate. References SGD1 and SGD2 denote gate lines in the drain side. SGS1 and SGS2 denote gate lines in the source side. References CG1 to CG8 denote control gate lines.

Next, steps of forming data line contacts CD1, CD2, and CD3 and data lines DL1, DL2, and DL3 will be briefly explained below.

A memory cell transistor 11 is formed on a semiconductor substrate 1, and thereafter, the entire substrate is covered with an inter-layer insulating film 51. Thereafter, data line contacts are patterned by a photolithography method and the inter-layer insulating film 51 is etched to open contacts.

Thereafter, a material to form data lines, e.g., aluminum is deposited and patterning is carried out by a photolithography method. Data line contacts CD1, CD2, and CD3 and data lines DL1, DL2, and DL3 are formed in the steps described above.

However, in accordance with high integration of elements, the distance between adjacent NAND cells is narrowed, and then, data line contacts CD1, CD2, and CD3 as well as data lines DL1, DL2, and DL3 are arranged to be close to each other, so that processing has become more difficult and causes an error in operation. For example, short-circuiting of wires tends to easily occur due to errors in formation of a resist pattern in steps of forming data lines DL1, DL2, and DL3 by a photolithography method or in etching of a conductive material used for wires.

In addition, the widths of data lines DL1, DL2, and DL3 to be connected with data line contacts CD1, CD2, and CD3 are normally designed to be larger than the opening diameter of each contact hole. This is performed so as to allow dimension errors in alignments, which are caused in a photolithography step and an etching step. In this case, the interval distance between adjacent data lines DL1, DL2, and DL3 is much narrower than the interval distance between the data line contacts CD1, CD2, and CD3. It is therefore more difficult to perform processing so that each of the data lines and contacts might not be short-circuited.

On the same grounds as described above, the width of a portion such as a transistor 12 or the like to be connected to the data line contacts CD1 to CD3 is designed to be larger than the opening diameter of each contact hole, in several cases. In this case, the interval distance between adjacent element regions is narrowed, so that formation of an element separation region 2 is affected. For example, a punch-through occurs between adjacent element regions, rendering it difficult to obtain a electric separation. In order to avoid this situation, the width of the element separation region 2 must be widened, thereby obstructing high integration of elements.

Thus, in accordance with high integration of elements, short-circuiting of wires tends to easily occur at data line contacts CD1 to CD3 or at data lines DL1 to DL3, or punch-through tends to easily occur between adjacent element regions, resulting in a problem that processing steps are rendered difficult.

In this respect, in the prior art, a proposal has been made with respect an EEPROM in which the interval distance between adjacent data line contacts CD1 to CD3 can be widened by arranging the lay-out.

For example, FIGS. 6 to 10 show another example of a conventional NAND type EEPROM. FIG. 6 is a plan view thereof. FIG. 7 is a cross-section cut along a line VII—VII in FIG. 6. FIG. 8 is a cross-section cut along a line VIII—VIII in FIG. 6. FIG. 9 is a cross-section cut along a line IX—IX in FIG. 6. FIG. 10 shows an equivalent circuit of FIG. 6.

A data line contact CD1 is provided at a first memory cell row constructed by connecting a plurality of memory cell transistors 11 formed on a semiconductor 1. A data line contact CD2 is provided at a second memory cell row constructed by connecting a plurality of memory cell transistors 11, formed on the semiconductor substrate 1, so as to be adjacent to the first memory cell row with an element separation region 2 inserted therebetween. The data line contacts CD1 and CD2 are arranged to be shifted from each other.

In the figures, the portions corresponding to portions shown in FIGS. 1 to 5 are denoted by same references and explanation thereof will be omitted herefrom.

However, in this method, the distance between gate lines SGD1 and SGD2 forming a transistor 12 is widened, so that the periodicity of the array of control gate lines CG1 to CG4 and gate line SGD1 to SGD2 which form memory cell transistors 11 is disturbed in the vicinity of the data line contacts CD1 to CD3, resulting in a possibility of affecting manufacturing steps. For example, the flatness of an inter-layer insulating film 51 is degraded in the vicinity of the data line contacts CD1 to CD3. Since the film thickness of an inter-layer insulating film 51 is reduced so that the surface of the inter-layer insulating film 51 is recessed, it is difficult to perform patterning with use of a photolithography method, resulting in a possibility of causing short-circuiting of wires between the data lines DL1 to DL3 or between data lines DL1 to DL3 and gate lines SGD1 to SGD2.

In addition, since the interval distance between the gate lines SGD1 and SGD2 forming transistors 12 is widened, it is difficult to selectively etch only the inter-layer insulating film 51 so that data line contacts CD1 to CD3 are formed in a self-alignment manner.

Thus, in conventional data line contacts provided at a plurality of memory cell rows disposed to be adjacent to each other with an element separation region inserted therebetween, the interval distance between adjacent rows is so small that short-circuiting of wires easily occurs in accordance with high integration of elements, and a problem that the flatness of an inter-layer insulating film is degraded occurs if the interval distance is widened.

BRIEF SUMMARY OF THE INVENTION

In view of the situation as described above, the present invention has an object of providing a semiconductor memory device in which the distance between adjacent data line contacts can be widened and short-circuiting of wires of data line contacts and data lines or punch-through in element regions which may cause an error operation can be prevented.

In order to achieve the above object, according to the present invention, there is provided a semiconductor memory device comprising: a memory cell array including a plurality of memory cell rows and a plurality of transistors in which a first memory cell row having a plurality of memory cell transistors connected and formed on a semiconductor substrate; a first transistor connected to either a drain side or a source side of the first memory cell row; a second memory cell row having a plurality of memory cell transistors connected and formed on the semiconductor substrate; a second transistor connected to either a drain side or a source side of the second memory cell row; a third memory cell row having a plurality of memory cell transistors connected and formed on the semiconductor substrate; a third transistor connected to either a drain side or a source side of the third memory cell row; a fourth memory cell row having a plurality of memory cell transistors connected and formed on the semiconductor substrate; and a fourth transistor connected to either a drain side or a source side of the third memory cell row, the first and second transistors being connected to either a data line or a source line through a first contact common to both the first and second transistors, forming a first memory cell group, the third and fourth transistors being connected to either a data line or a source line through a second contact common to both the third and fourth transistors, forming a second memory cell group, gate electrodes of the first and third transistors are connected in common to a first gate line, gate electrodes of the second and fourth transistors being connected in common to a second gate line, the first and second memory cell groups being separated from each other such that an element separation region is inserted between the first and second memory cell groups, and the first and second gate lines are provided such that the gate electrodes of the transistors of every pairs between which the element separation region is inserted are connected with each other; and a third gate line provided at a space between the first and second gate lines, the first contact being formed between the first and third gate lines, and the second contact being formed between the second and third gate lines.

In addition, according to the present invention, there is provided a semiconductor memory device comprising a memory cell array including a plurality of memory cell rows and a plurality of transistors in which a first memory cell row having of a plurality of memory cell transistors connected and formed on a semiconductor substrate; a first transistor connected to either a drain side or a source side of the first memory cell row; a second memory cell row having a plurality of memory cell transistors connected and formed on the semiconductor substrate; a second transistor connected to either a drain side or a source side of the second memory cell row; a third memory cell row having a plurality of memory cell transistors connected and formed on the semiconductor substrate; a third transistor connected to either a drain side or a source side of the third memory cell row; a fourth memory cell row having a plurality of memory cell transistors connected and formed on the semiconductor substrate; and a fourth transistor connected to either a drain side or a source side of the third memory cell row, the memory cell rows and the transistors constituting a memory cell array in which the first and second transistors are connected to either a data line or a source line through a first contact common to both the first and second transistors, forming a first memory cell group, the third and fourth transistors being connected to either a data line or a source line through a second contact common to both the third and fourth transistors, forming a second memory cell group, gate electrodes of the first and third transistors being connected in common to a first gate line, gate electrodes of the second and fourth transistors being connected in common to a second gate line, the first and second memory cell groups being separated from each other such that an element separation region is inserted between the first and second memory cell groups, and the first and second gate lines are provided such that the gate electrodes of the transistors of every pairs between which the element separation region is inserted are connected with each other; a first spacing element connected between the first contact and the second transistor; and a second spacing element connected between the second contact and the third transistor.

Further, according to the present invention, there is provided a semiconductor memory device comprising: a first memory cell row having a plurality of memory cell transistors connected and formed on a semiconductor substrate; a first transistor connected to either a drain side or a source side of the first memory cell row; a second memory cell row having a plurality of memory cell transistors connected and formed on the semiconductor substrate; a second transistor connected to either a drain side or a source side of the second memory cell row and having a longer gate length than that of the first transistor; a third memory cell row having a plurality of memory cell transistors connected and formed on the semiconductor substrate; a third transistor connected to either a drain side or a source side of the third memory cell row; a fourth memory cell row having a plurality of memory cell transistors connected and formed on the semiconductor substrate; and a fourth transistor connected to either a drain side or a source side of the fourth memory cell row and having a shorter gate length than that of the third transistor, the memory cell rows and the transistors constituting a memory cell array in which the first and second transistors being connected to either a data line or a source line through a first contact common to both the first and second transistors, forming a first memory cell group, the third and fourth transistors are connected to either a data line or a source line through a second contact common to both the third and fourth transistors, forming a second memory cell group, gate electrodes of the first and third transistors are connected in common to a fist gate line, gate electrodes of the second and fourth transistors being connected in common to a second gate line, the first and second memory cell groups being separated from each other such that an element separation regions is inserted between the first and second memory cell groups, and the first and second gate lines are provided such that the gate electrodes of the transistors of every pairs between which the element separation region is inserted are connected with each other.

Further, according to the present invention, there is provided a semiconductor memory device comprising: first, second, third, and fourth memory cell rows each constituted by connecting a plurality of memory cell transistors formed on a semiconductor substrate, such that the first, second, third, and fourth memory cell rows are provided to form a memory cell array, wherein the first memory cell row is connected to the second memory cell row through a first transistor, the third memory cell row is connected to the fourth memory cell row through a second transistor, the first and second memory cell rows are provided so as to be respectively adjacent to the third and fourth memory cell rows such that element separation regions are respectively inserted between adjacent memory cell rows, gate electrodes of the first and second transistors are connected in common to a first gate line, a first contact to be connected to either a data line or a source line is provided between the first transistor and the first memory cell row, and a second contact to be connected to either a data line a source line is provided between the second transistor and the fourth memory cell row.

In the semiconductor memory device constructed in a structure as described above, according to the present invention, the distance between adjacent contacts can be widened and it is possible to prevent short-circuiting of wires of data line contacts and data lines or punch-through in element regions which may cause an error operation.

Additional object and advantages of the invention will be set forth in the description which follows, and in part will be obvious from the description, or may be learned by practice of the invention. The object and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 18 shows a voltage relationship between respective components during operation of an NAND type EEPROM shown in FIG. 11 according to the first embodiment of the present invention;

FIG. 39 shows a voltage relationship between respective components during operation of a NAND type EEPROM shown in FIG. 35 according to the fifth embodiment of the present invention;

FIG. 45 shows a voltage relationship between respective components during operation of a NAND type EEPROM shown in FIG. 40 according to the sixth embodiment of the present invention;

FIG. 47 is a cross-section cut along a line XXXXVII—XXXXVII in FIG. 46;

FIG. 48 is a cross-section cut along a line XXXXVIII—XXXXVIII in FIG. 46;

FIG. 49 is a cross-section cut along a line XXXXIX—XXXXIX in FIG. 46;

DETAILED DESCRIPTION OF THE INVENTION

In the following, embodiments of the present invention will be explained in details, with reference to the drawings.

Figure 1:
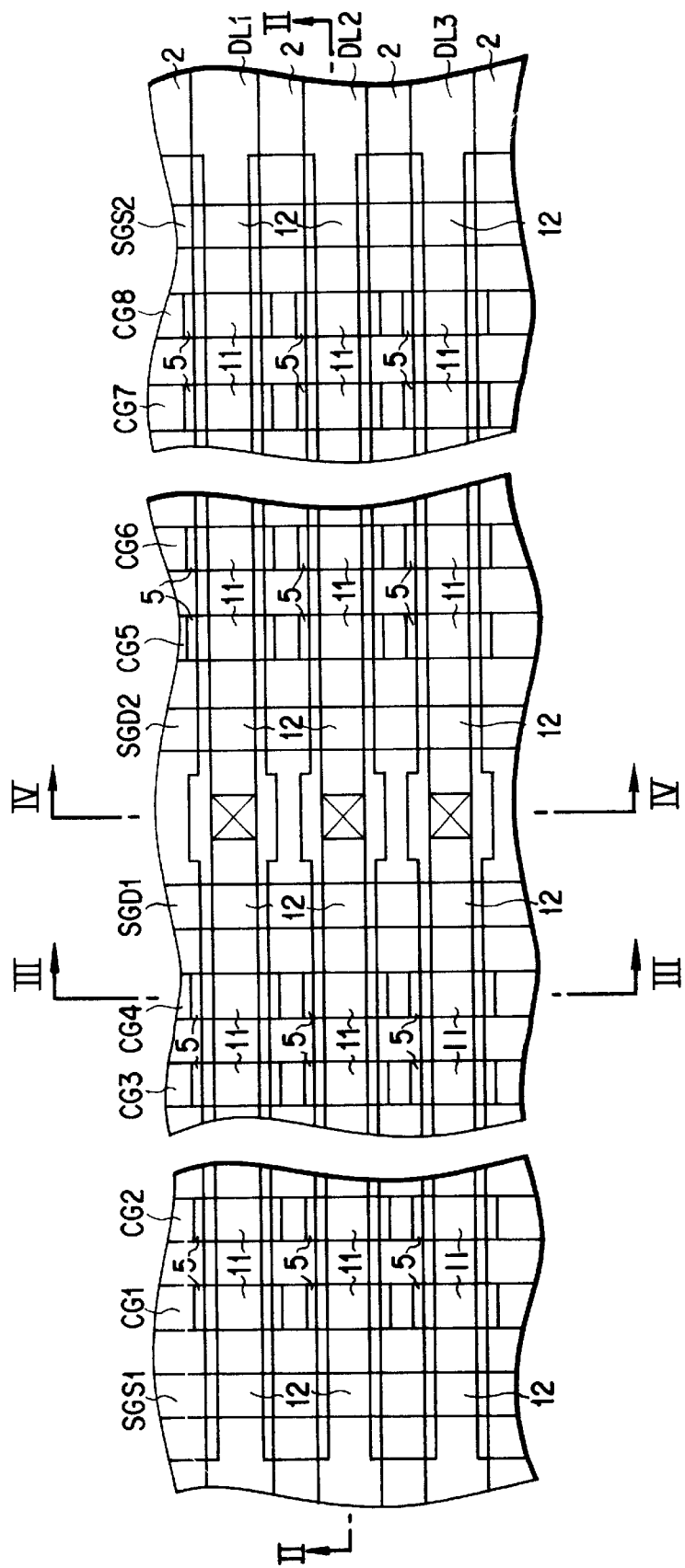
FIG. 1 is a plan view showing a layout of a memory cell array of a conventional NAND type EEPROM.
Figure 2:
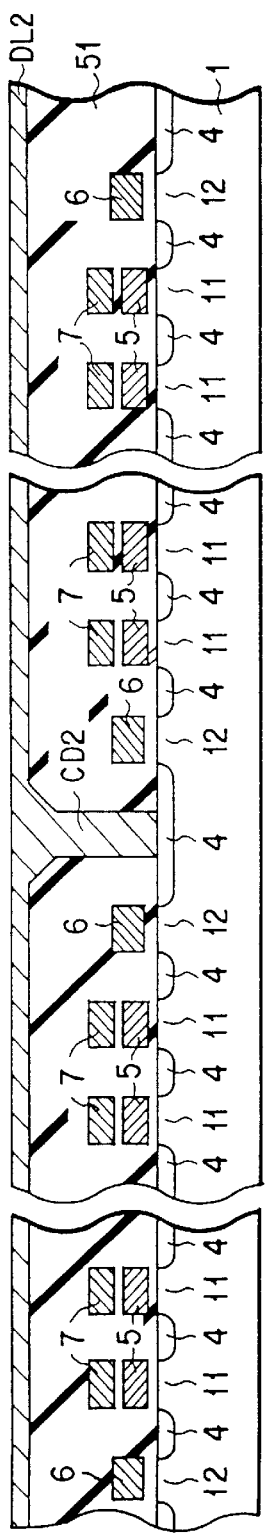
FIG. 2 is a cross-section cut along a line II—II of FIG. 1.
Figure 3:
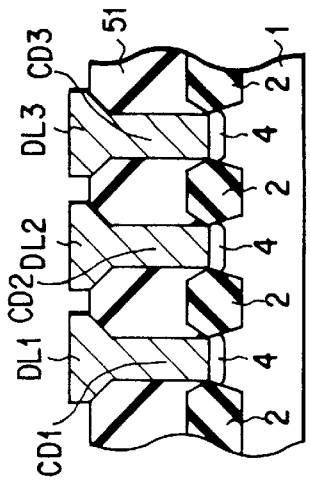
FIG. 3 is a cross-section cut along a line III—III of FIG. 1.
Figure 4:
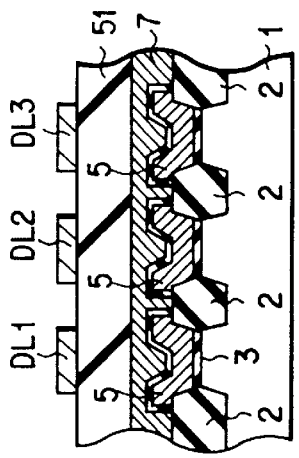
FIG. 4 is a cross-section cut along a line IV—IV of FIG. 1.
Figure 5:
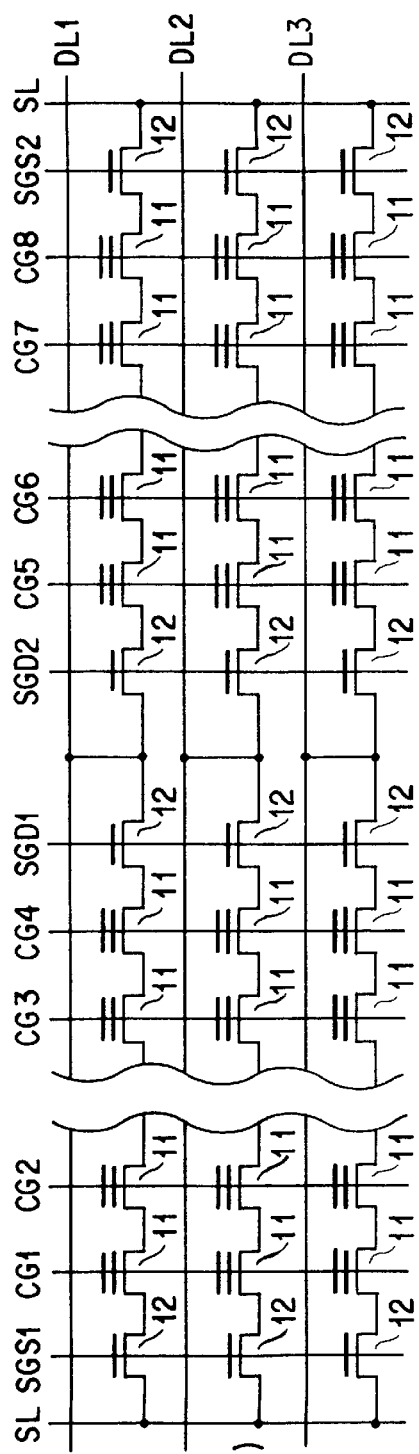
FIG. 5 shows an equivalent circuit of FIG. 1.
Figure 6:
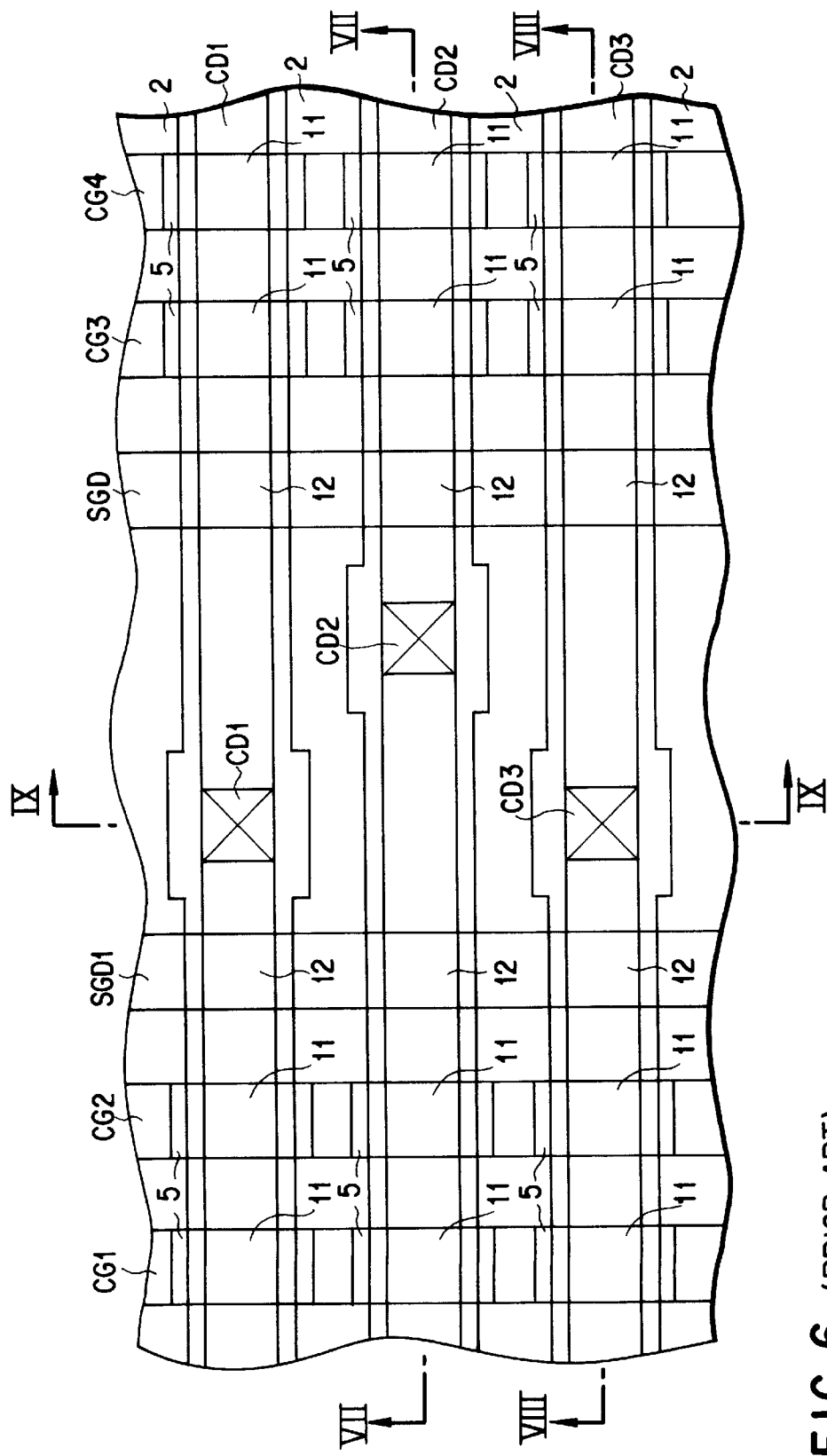
FIG. 6 is a plan view showing another layout of a memory cell array of another conventional NAND type EEPROM.
Figure 7:
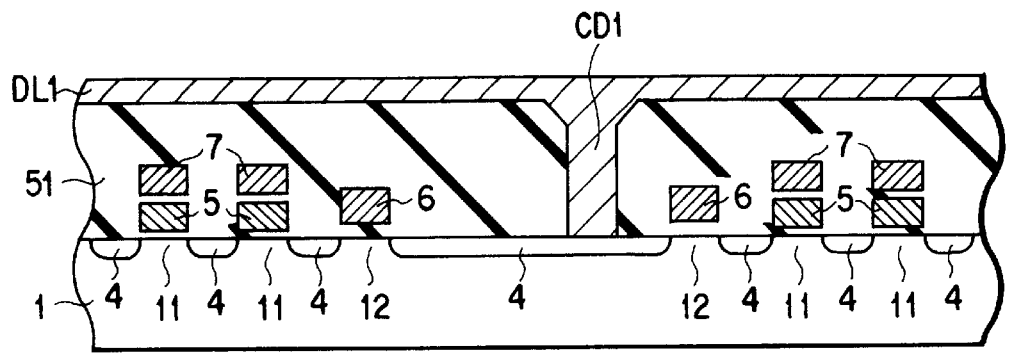
FIG. 7 is a cross-section cut along a line VII—VII of FIG. 6.
Figure 8:
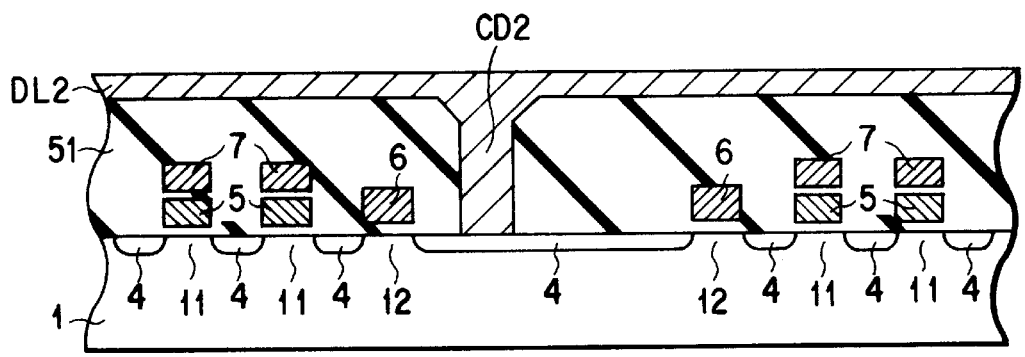
FIG. 8 is a cross-section cut along a line VIII—VIII of FIG. 6.
Figure 9:
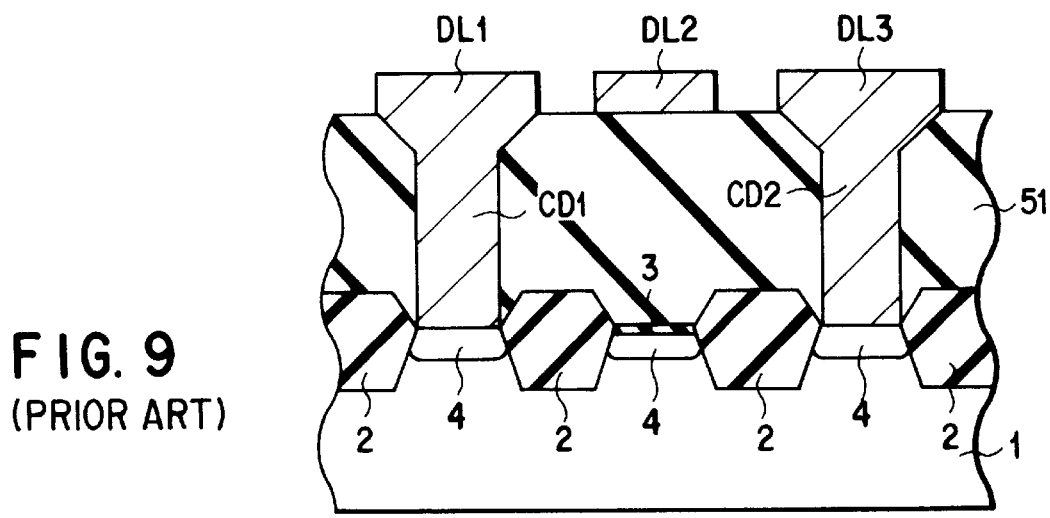
FIG. 9 is a cross-section cut along a line IX—IX of FIG. 6.
Figure 10:
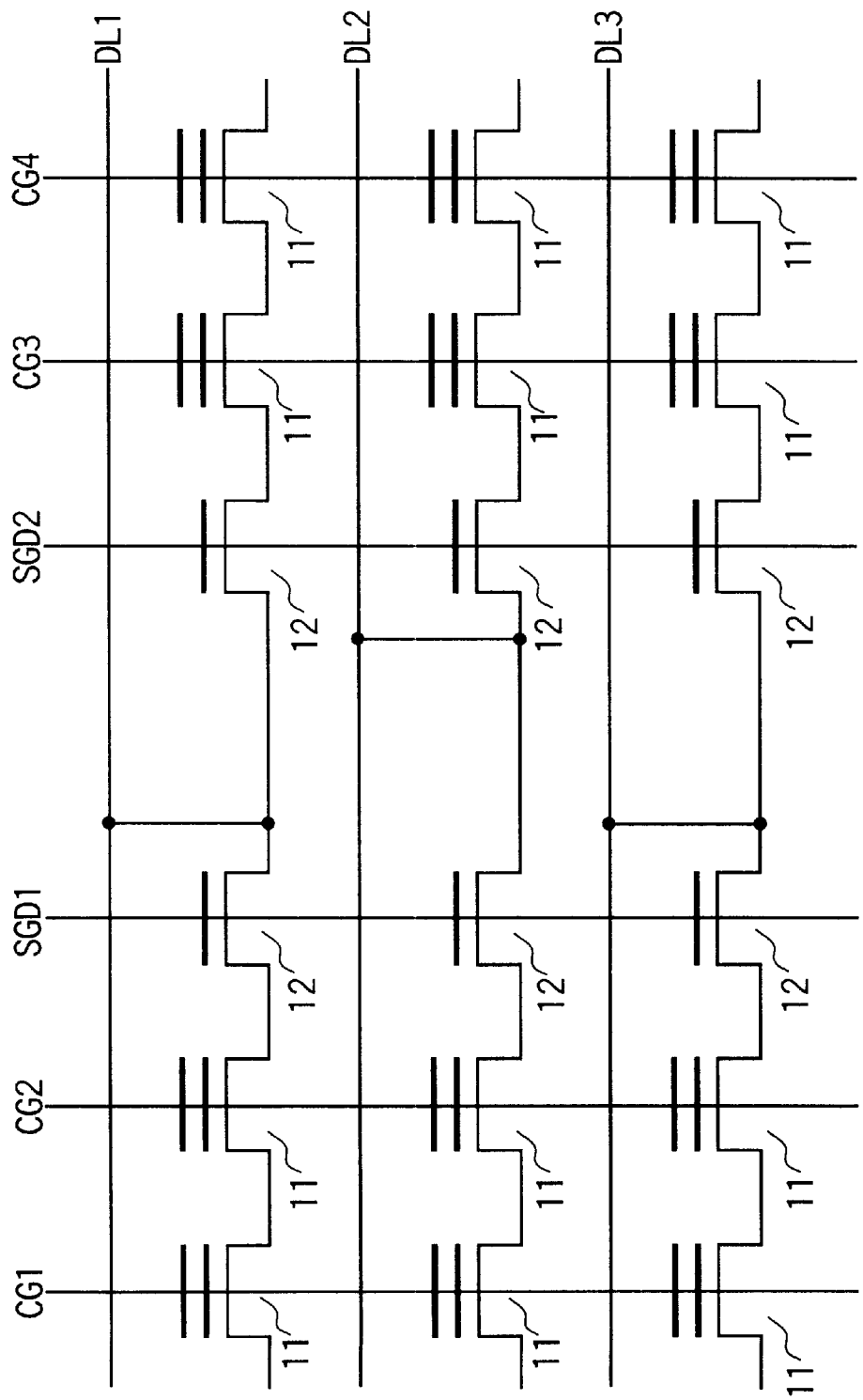
FIG. 10 shows an equivalent circuit of FIG. 6.
Figure 11:
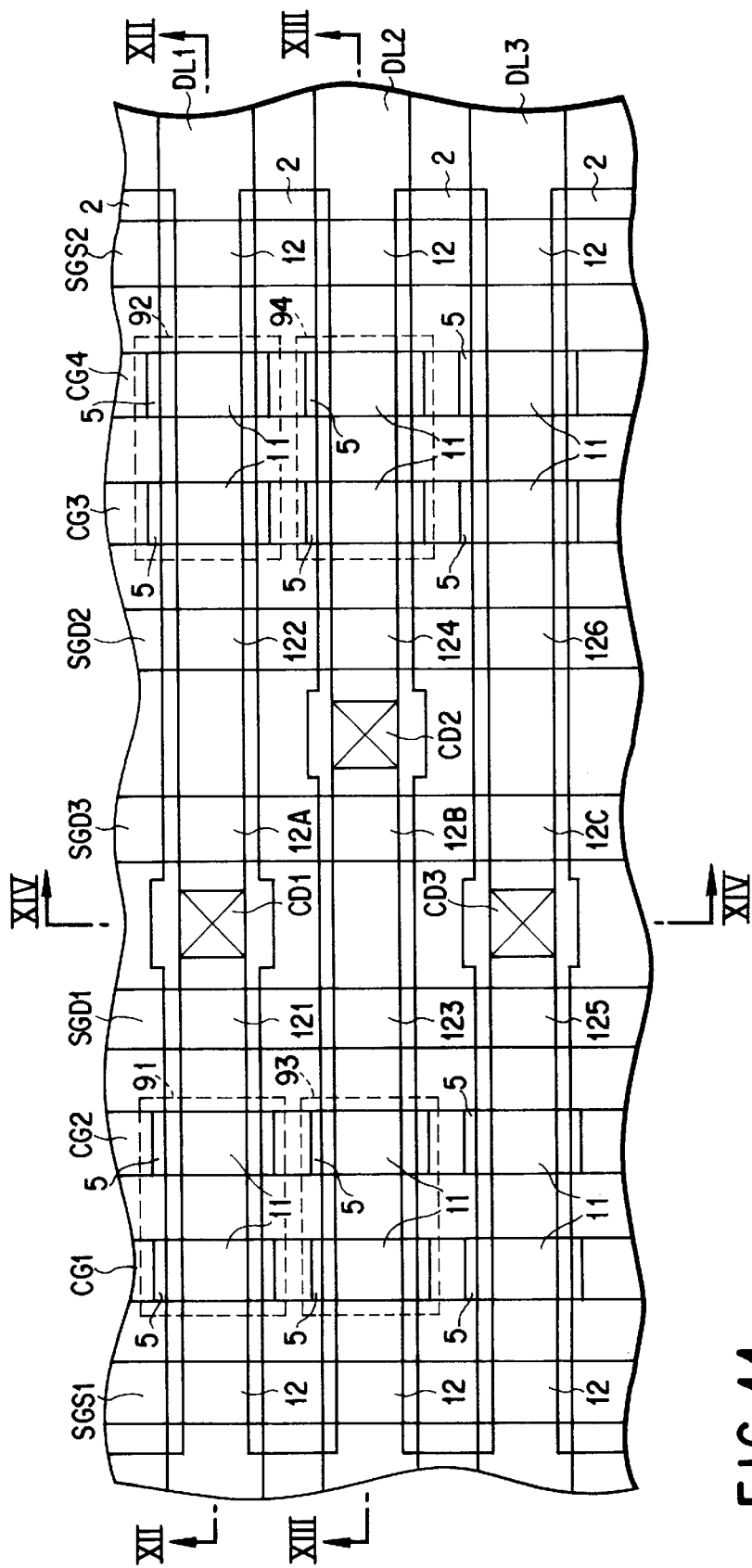
FIG. 11 is a plan view showing a layout of a memory cell array of a NAND type EEPROM according to the first embodiment of the present invention.

FIG. 11 is a plan view showing a layout of a memory cell array of a NAND type EEPROM, showing a first embodiment of the present invention.

Figure 12:
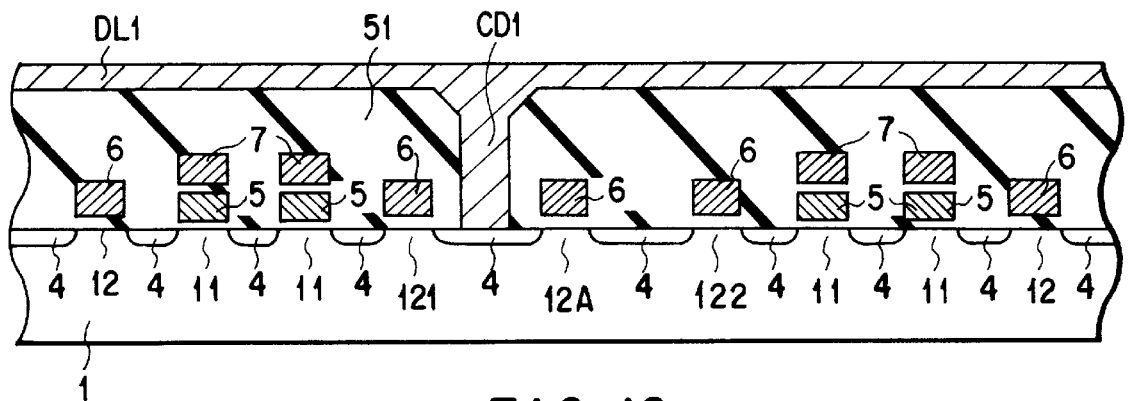
FIG. 12 is a cross-section cut along a line XII—XII of FIG. 11.
Figure 13:
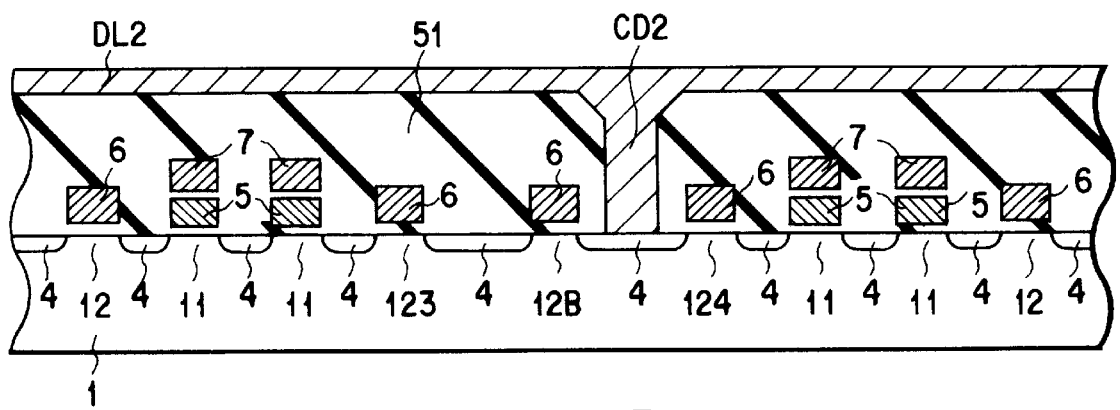
FIG. 13 is a cross-section cut along a line XIII—XIII of FIG. 11.
Figure 14:
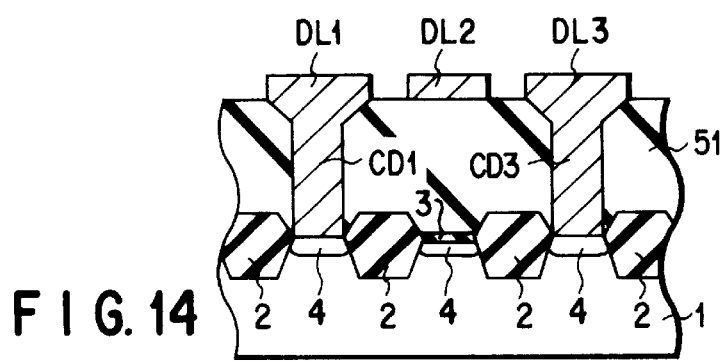
FIG. 14 is a cross-section cut along a line XIV—XIV of FIG. 11.
Figure 15:
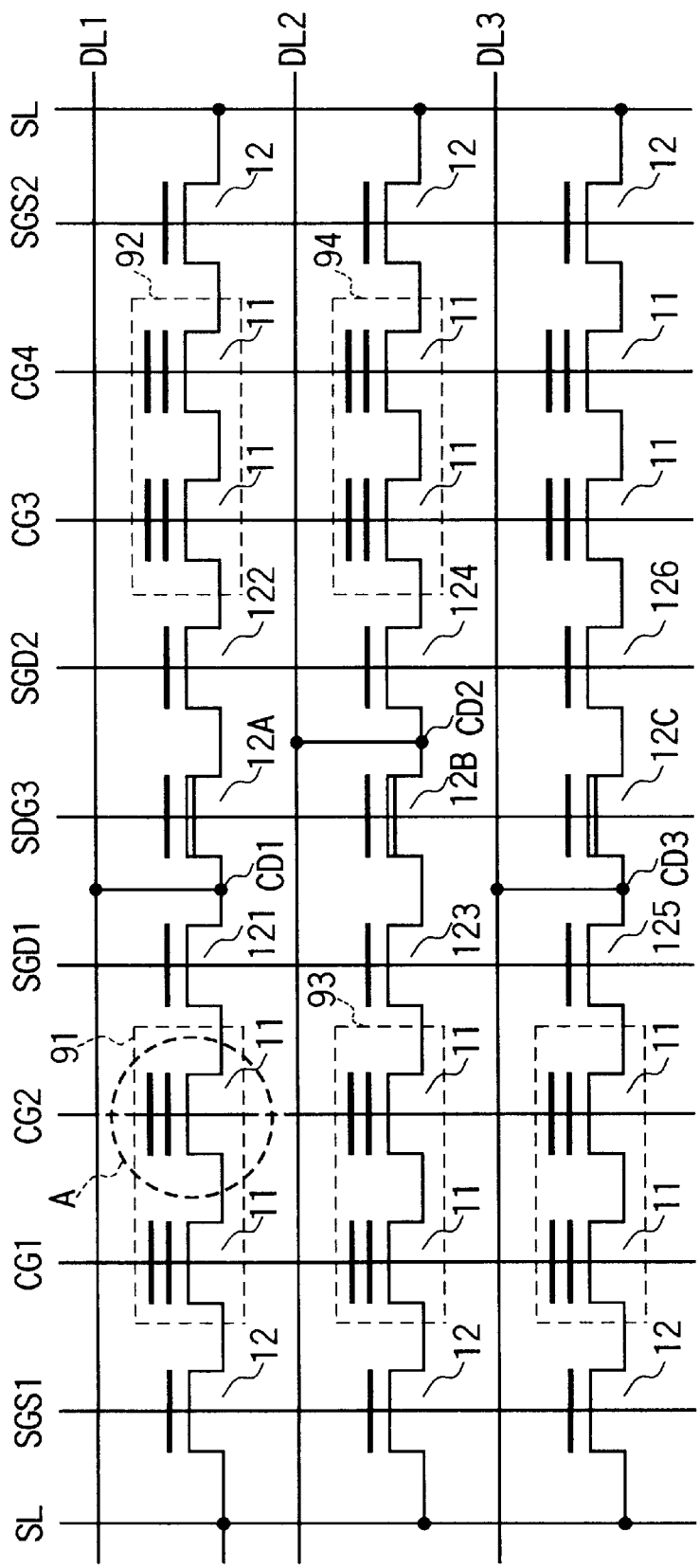
FIG. 15 shows an equivalent circuit of FIG. 11.

FIG. 12 is a cross-section cut along a line XII—XII in FIG. 11. FIG. 13 is a cross-section cut along a line XIII—XIII in FIG. 11. FIG. 14 is a cross-section cut along a line XIV—XIV in FIG. 11. FIG. 15 shows an equivalent circuit of the circuit shown in FIG. 11.

Specifically, a plurality of memory cell transistors 11 each having a charge storage region are formed on a semiconductor substrate 1, and every two memory cell transistors 11 are connected in series with each other such that pairs of memory cell transistors 11 constitute a first NAND type memory cell row 91, a second NAND type memory cell row 92, a third NAND type memory cell row 93, a fourth NAND type memory cell row 94, and other NAND type memory cell rows.

Each of the memory cell transistors 11 consists of a source-drain diffusion layer 4, a floating gate 5 made of a conductive layer, a control gate 7 made of a conductive layer, and the like.

The end portion of the first NAND type memory cell row 91 in the drain side is connected with a source of a transistor 121 consisting of a source-drain diffusion layer 4, a gate 6 made of a conductive layer, and the like. A drain of the transistor 121 is connected to a data line DL1 through a first data line contact CD1.

The end portion of the first NAND type memory cell row 91 is connected with a source line SL through a transistor 12 consisting of a source-drain diffusion layer 4, a gate 6 made of a conductive layer, and the like.

In addition, the end portion of the second NAND type memory cell row 92 is connected with the source of a transistor 122 consisting of a source-drain diffusion layer 4, a gate 6 made of a conductive layer, and the like. A drain of the transistor 122 is connected with the source of a transistor 12A consisting of a source-drain diffusion layer 4, a gate 6 made of a conductive layer, and the like.

A drain of the transistor 12A is connected to the data line DL1 through a first data line contact CD1 common to the first NAND type memory cell row 91. The end portion of the second NAND type memory cell row 92 in the source side is connected to a source line SL through a transistor 12 consisting of a source-drain diffusion layer 4, a gate 6 made of a conductive layer, and the like.

To the drain-side end of the third NAND type memory cell array 93 the source of a transistor 123 is connected, the transistor 123 having a source/drain diffusion layer 4 and gate 6, etc., formed of a conductive layer. To the drain of the transistor 123 the source of the transistor 12B is connected, the transistor 12B having a source/drain diffusion layer 4 and gate 6, etc., formed of a conductive layer. The drain of the select transistor 12B is connected to the data line DL2 via a second data line contact CD2. To the source-side end of the third NAND type memory cell array 93 a source line SL is connected via a transistor 12 having a source/drain diffusion layer 4 and select gate 6, etc., of a conductive layer. A transistor 124 is connected at its source to the drain side end of the fourth NAND type memory cell array 94 and has a source/drain diffusion layer 4 and gate 6, etc., of a conductive layer. The drain of the transistor 124 is connected to the data line DL2 via the data line contact CD2 shared by the third NAND type memory array 93. The source-side end of the fourth NAND type memory cell array 94 is connected to the source line SL via the transistor 12 having a source/drain diffusion layer 4 and gate 6, etc., formed of a conductive layer.

Likewise, the end portion of the drain side of another NAND type memory cell row constructed by other memory cell transistors 11 every two of which are connected in series with each other is connected to a data line DL3, . . . , through transistors 125, 126, . . . , 12C, . . . , each consisting of a source-drain diffusion layer 4, a gate 6 made of a conductive layer, and the like, and through a data line contact CD3, . . . . Also, the end portion of the source side of this another NAND type memory cell constructed by other memory cell transistors 11 every two of which are connected in series with each other is connected to a source line SL, through a transistor 12 consisting of a source-drain diffusion layer 4, a gate 6 made of a conductive layer, and the like. In the above explanation, although each NAND cell is constructed by connecting every two memory cell transistors 11 in series with each other (as shown in FIG. 15), the number of memory cell transistors 11 to be connected in series with each other may be 4, 8, or 16, and generally, $2^n$ (where n is a positive integer) memory cell transistors 11 are connected in series to form a NAND cell.

In addition, gate electrodes of the first transistor 121 and the third transistor 123 are connected together to a first selection gate line SGD1. Gate electrodes of the second transistor 122 and the fourth transistor 124 are connected together to a second selection gate line SGD2. In addition, gate electrodes of the transistor 12A and the transistor 12B are connected together to a third selection gate line SGD3. The third gate line SGD3 is connected between the first gate line SGD1 and the second gate line SGD2.

A first data line contact CD1, a second data line contact CD2, and a third data line contact CD3 are respectively connected between the gate lines SGD1 and SGD3, between the gate lines SGD3 and SGD2, and between the gate lines SGD1 and SGD3, such that the contacts CD1 to CD3 are arranged to be shifted from each other. Therefore, the distance between adjacent data line contacts CD1 and CD2 or between adjacent data line contacts CD2 and CD3 can be widened, so that short-circuiting of wires can be prevented.

Gate electrodes of a plurality of memory cell transistors 11 are respectively connected to corresponding control gate lines CG1 to CG4, and gate electrodes of a plurality of transistors 12 in the source side are respectively connected to corresponding gate lines SGS1 to SGS2.

A first memory cell unit is constructed by the first NAND type memory cell row 91, the second NAND type memory cell row 92, the transistors 121, 122, 12A, the first data line contact CD1, and the first data line DL1. A second memory cell unit is constructed by the third NAND type memory cell row 93, the fourth NAND type memory cell row 94, the transistors 123, 124, 12B, the second data line contact CD2, and the second data line CD2. A plurality of first and second memory cell units are provided with an element separation region 2 inserted therebetween.

In FIG. 14, reference 3 denotes a gate insulating film, and reference 51 denotes an inter-layer insulating film. The floating gate 5 and the control gate 7 shown in FIGS. 12 and 13 are insulated from each other by another ONO (Oxide-Nitride-Oxide) layered film (not shown).

Next, step of manufacturing an EEPROM as an embodiment described above will be explained with reference to FIGS. 16A to 16C and FIGS. 17A to 17C.

Figure 16A:
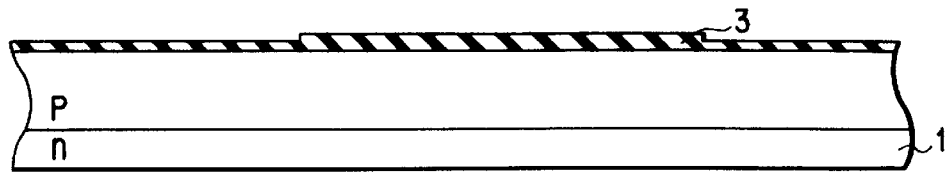
FIGS. 16A to 16C show steps of manufacturing an EEPROM corresponding to the cross-section cut along the line XII—XII in FIG. 11.
Figure 16B:
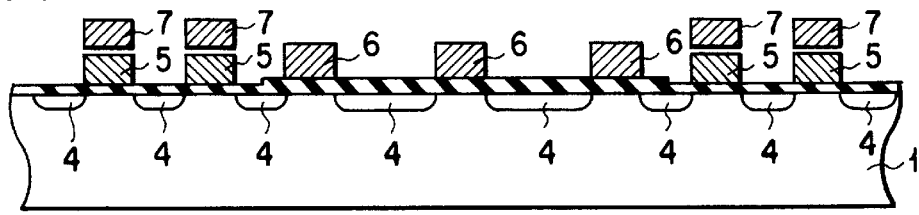
Figure 16C:
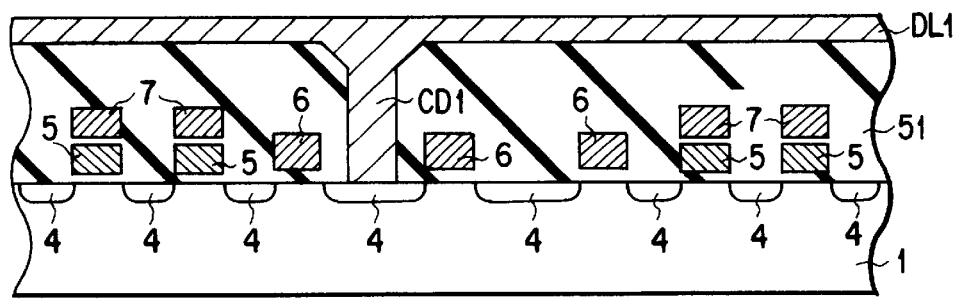

Note that FIGS. 16A to 16C are cross-sections cut along a line XII—XII in FIG. 11 and FIGS. 17A to 17C are cross-sections cut along a line XIV—XIV in FIG. 11.

Figures 17A, 17B:
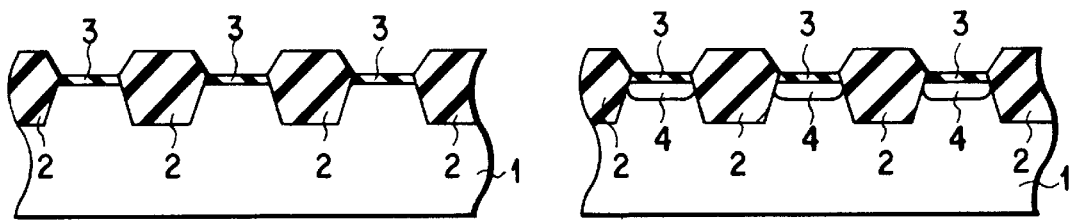
FIGS. 17A to 17C show steps of manufacturing an EEPROM corresponding to the cross-section cut along the line XII—XII in FIG. 11.

As shown in FIG. 16A, a semiconductor substrate 1 and a reverse conductive p-type well are formed on the surface of a semiconductor substrate 1 whose conductivity type is n-type, and thereafter, as shown in FIG. 17A, element separation regions 2 are formed.

Subsequently, appropriate channel ion implantation (not shown) for adjusting a threshold value is performed on a region where a gate is formed. Subsequently, a gate insulating film 3 is formed on the surface of the P-well described above.

Subsequently, as shown in FIG. 16B, a polycrystal silicon film is deposited as a first layer gate electrode to form floating gates 5 and gates 6. Next, as shown in FIG. 17B, the polycrystal silicon film is etched and removed from the element separation region 2, such that the portions of the gate electrodes 5 and 6 are not removed but remain thereon. Thereafter, a second gate insulating film (not shown) is formed by heat oxidization, and a layered film consisting of a polycrystal silicon film and a tungsten silicide film is formed as a second layer gate electrode (not shown) to form control gates 7 is formed.

Further, an insulating film as a mask, e.g., a silicon nitride film is deposited. The mask insulating film is subjected to patterning, and thereafter, the second layer gate electrode, the second gate insulating film, and the first layer gate electrode are subjected to patterning by self-alignment. After gates are formed, source-drain diffusion layers 4 are formed by ion-implantation.

Figure 17C:
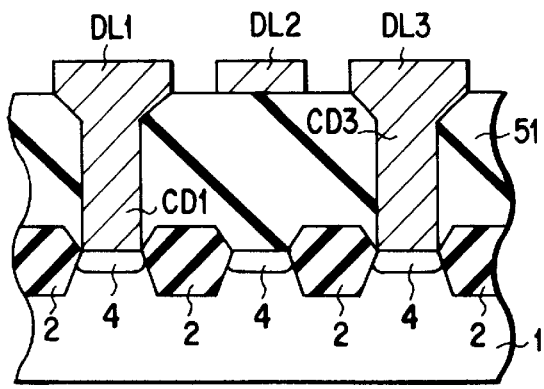

Thereafter, as shown in FIGS. 16C and 17C, an inter-layer insulating film 51 is deposited to cover the entire surface. Contact holes are opened and data line contacts CD1 to CD3 are formed. Data lines DL1 to DL3 are provided on the inter-layer insulating film 51 by an aluminum film, to complete an EEPROM shown in FIG. 11.

Next, operation of a NAND type EEPROM of the present embodiment will be explained.

FIG. 18 shows a voltage relationship between respective portions. The voltage relationship is shown, supposing that the memory cell transistor selected for writing and reading is the memory cell transistor A surrounded by a circle of a dotted line in FIG. 15.

Data erasure is performed at once (in form of batch-erasure) on all memory cell transistors 11 which construct the selected first NAND type memory cell row 91. In this case, all the control gate lines CG1 and CG2 in the first NAND type memory cell row 91 are set to 0V, and an erasure voltage Vppe is applied to the p-type well and selected gate lines SGD1, SGD2, SGS1, and SGS2. In this case, electrons are discharged from the floating gate 5 and the threshold voltage of the memory cell transistor A moves in a negative direction, to form an erasure state.

Data writing is selectively performed for every memory cell transistor 11. A writing voltage Vppw is applied to the control gate line CG2 of a selected memory cell transistor A, and a middle potential Vm is applied to another control gate line CG1 and a selection gate line SGD1 in the drain side. 0V is applied to a selection gate line SGS1 in the source side. The p-type well is applied with 0V, and a data line DL1 connected to the selected memory cell transistor A is applied with 0V. Other data lines DL2 and DL3 are applied with a middle potential Vm. In this manner, electrons are injected into the floating gate 5 of the selected memory cell transistor A by a tunnel current, and the threshold value of the memory cell transistor A is shifted in a positive direction, to form a writing state.

In data reading, 0V is applied to the control gate line CG2, a power source potential Vcc is applied to another control gate line CG1 and selection gate lines SGD1 and SGD2, and a voltage Vcc is applied to a data line DL1. In this manner, a determination is made as to data written in the selected memory cell transistor A selected, depending on whether or not a current flows through the data line DL1.

Transistors 12A, 12B, and 12C must be rendered conductive, respectively corresponding to cases where the transistor 122, 123, and 126 are rendered conductive.

In the embodiment shown in FIG. 11, transistors of a depression type are used. However, it is possible to use transistors of an enhancement type which have gate electrodes biased to be rendered conductive.

Figure 19:
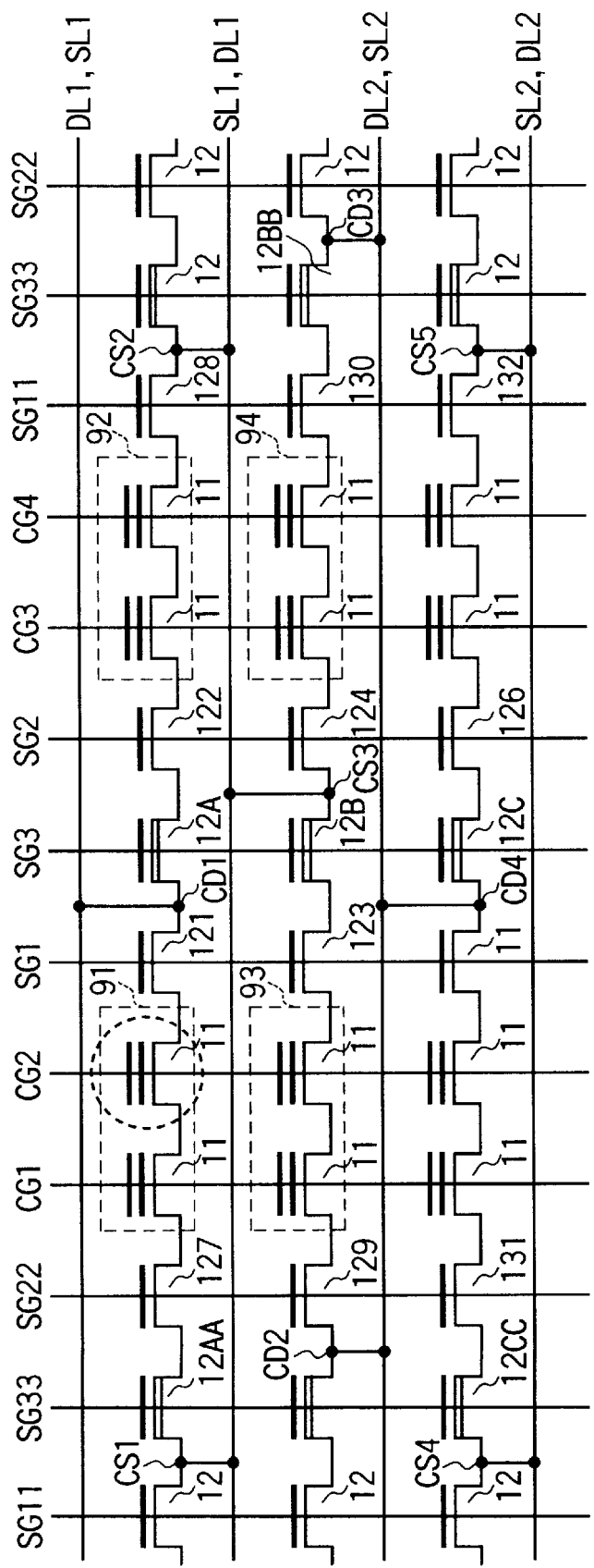
FIG. 19 is an equivalent circuit, showing a memory cell array of a modification of the first embodiment of the present invention shown in FIG. 11.

FIG. 19 is an equivalent circuit, showing a memory cell array of a modification of the first embodiment according to the present invention shown in FIG. 11.

Specifically, a plurality of memory cell transistors 11 each having a charge storage region are formed, and every two of the memory cell transistors 11 are connected in series with each other, so as to form a first NAND type memory cell row 91, a second NAND type memory cell row 92, a third NAND type memory cell row 93, a fourth NAND type memory cell row 94, . . . .

The end portion of the source side of the first NAND type memory cell row 91 is connected with a drain of a transistor 127, and a source of the transistor 127 is connected with a drain of a transistor 12AA. A source of the transistor 12AA is connected with a source line SL1 through a source line contact CS1.

The end portion of the drain side of the first NAND type memory cell row 91 is connected with a source of a transistor 121, and a drain of the transistor 121 is connected to a data line DL1 through a first data line contact CD1.

The end portion of the source side of the second NAND type memory cell row 92 is connected with a drain of the transistor 128, and a source of the transistor 128 is connected to a source line SL1 through a second source line contact CS2.

The end portion of the drain side of the second NAND type memory cell row 92 is connected with a source of a transistor 122, and a drain of the transistor 122 is connected with a source of a transistor 12A. A drain of the transistor 12A is connected to the data line DL1 through the first data line contact CD1 common to the first NAND type memory cell row 91.

The end portion of the source side of the third NAND type memory cell row 93 is connected with a drain of a transistor 123, and a source of the transistor 123 is connected with a drain of a transistor 12B. A source of the transistor 12B is connected to a source line SL1 through a third source line contact CS3.

The end portion of the drain side of the third NAND type memory cell row 93 is connected with a source of a selection transistor 129, and a drain of the selection transistor 129 is connected to a data line DL2 through a second data line contact CD2.

In addition, the end portion of the source side of the fourth NAND type memory cell row 94 is connected with a drain of a transistor 124. A source of the transistor 124 is connected to a source line SL1 through a third source line contact CS3 common to the third NAND type memory cell 93.

The end portion of the drain side of the fourth NAND type memory cell row 94 is connected with a source of a transistor 130. A drain of the transistor 130 is connected with a source of a selection transistor 12BB. A drain of the transistor 12BB is connected to a data line DL2 through a third data line contact CD3.

Likewise, the end portions of the source sides of NAND type memory cell rows each constructed by connecting every two of other memory cell transistors 11 in series with each other is connected to the source line SL2 through transistors 131, 132, . . . , 12CC, . . . , and through source contacts CS4, CS5, . . . .

The end portions of the drain sides of the NAND type memory cell rows each constructed by connecting every two of other memory cell transistors 11 in series with each other are connected to the data line DL2 through transistors 125, 126, . . . , 12C, . . . , and through data line contacts CD4, . . . .

In addition, gate electrodes of the first transistor 121 and the third transistor 123 are connected together to the first gate line SG1. Gate electrodes of the second transistor 122 and the fourth transistor 124 are connected together to the second gate line SG2.

Further, gate electrodes of the transistor 12A and the transistor 12B are connected together to the third gate line SG3. Similarly, gate electrodes of the transistors 127 and 129 are connected together to the gate line SG22.

Gate electrodes of the transistors 128 and 130 are connected together to the gate line SG11. A third selection gate line SG3 is formed between the first selection gate line SG1 and the second selection gate line SG2.

The first data line contact CD1, the second data line contact CD2, and the third data line contact CD3 are respectively provided between the gate line SG1 and the gate line SG3, between the gate line SG3 and the gate line SG2, and between the gate line SG1 and the gate line SG3, such that the data line contacts CD1 to CD3 are shifted from each other.

Therefore, the distance between adjacent contacts CD1 and CS3 or between CS3 and CD4 can be widened so that short-circuiting of wires can be prevented.

Gate electrodes of a plurality of memory cell transistors 11 are respectively connected to corresponding control gate lines CG1 to CG4. In FIG. 19, as shown in this figure, data lines DL1, DL2, . . . , and source lines SL1, SL2, . . . , can be switched between each other.

The first NAND type memory cell row 91, the second NAND type memory cell row 92, the transistors 121, 122, 12A, the first data line contact CD1, and the first data line DL1 construct a first memory cell group.

The third NAND type memory cell row 93, the fourth NAND type memory cell row 94, the transistors 123, 124, 12B, the third source line contact CS3, and the first source line SL1 construct a second memory cell group. A plurality of first and second memory cell groups are provided with an element separation region 2 inserted therebetween.

Figure 20:
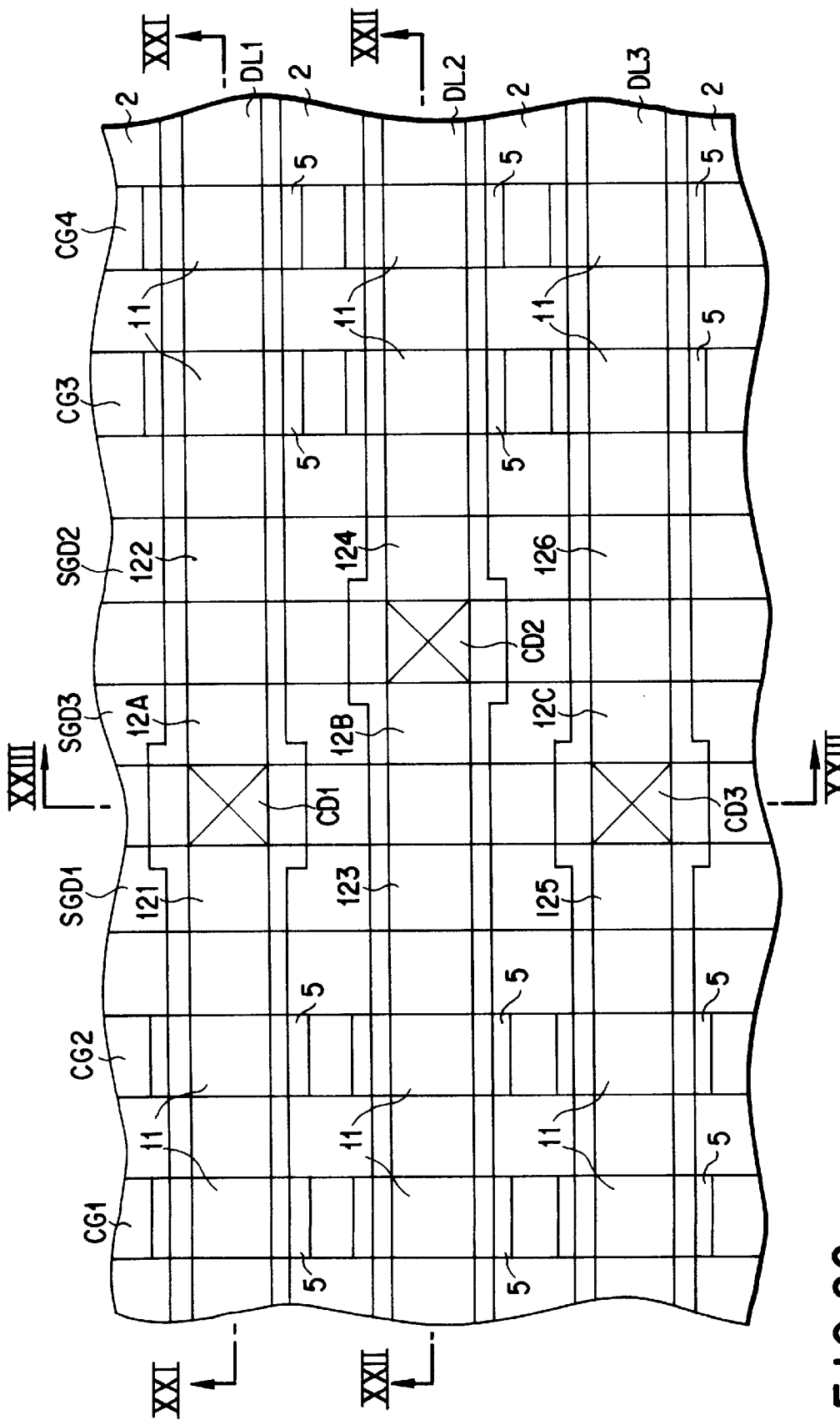
FIG. 20 is a plan view of a layout of an NAND type EEPROM, showing a second embodiment of the present invention.
Figure 21:
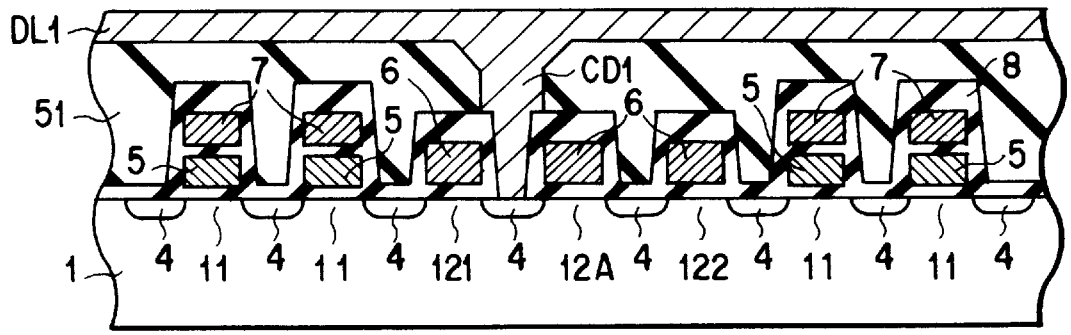
FIG. 21 is a cross-section cut along a line XXI—XXI in FIG. 20.
Figure 22:
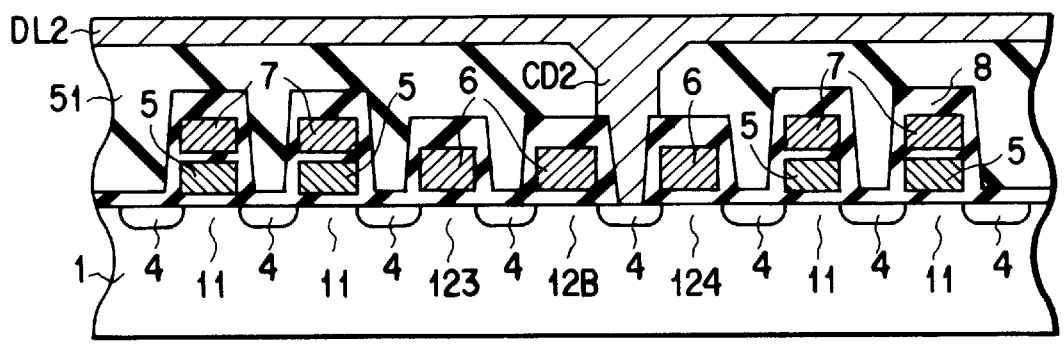
FIG. 22 is a cross-section cut along a line XXII—XXII in FIG. 20.
Figure 23:
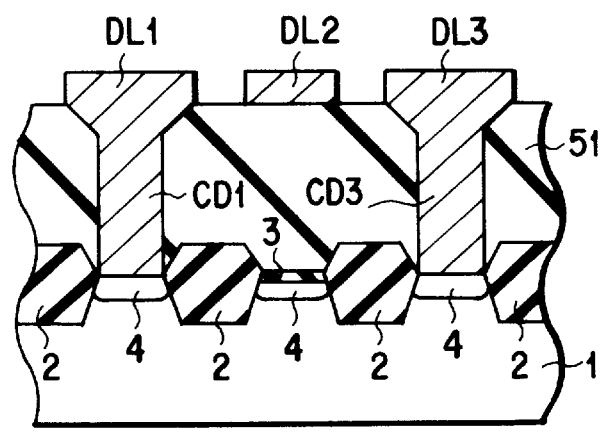
FIG. 23 is a cross-section cut along a line XXIII—XXIII in FIG. 20.
Figure 24:
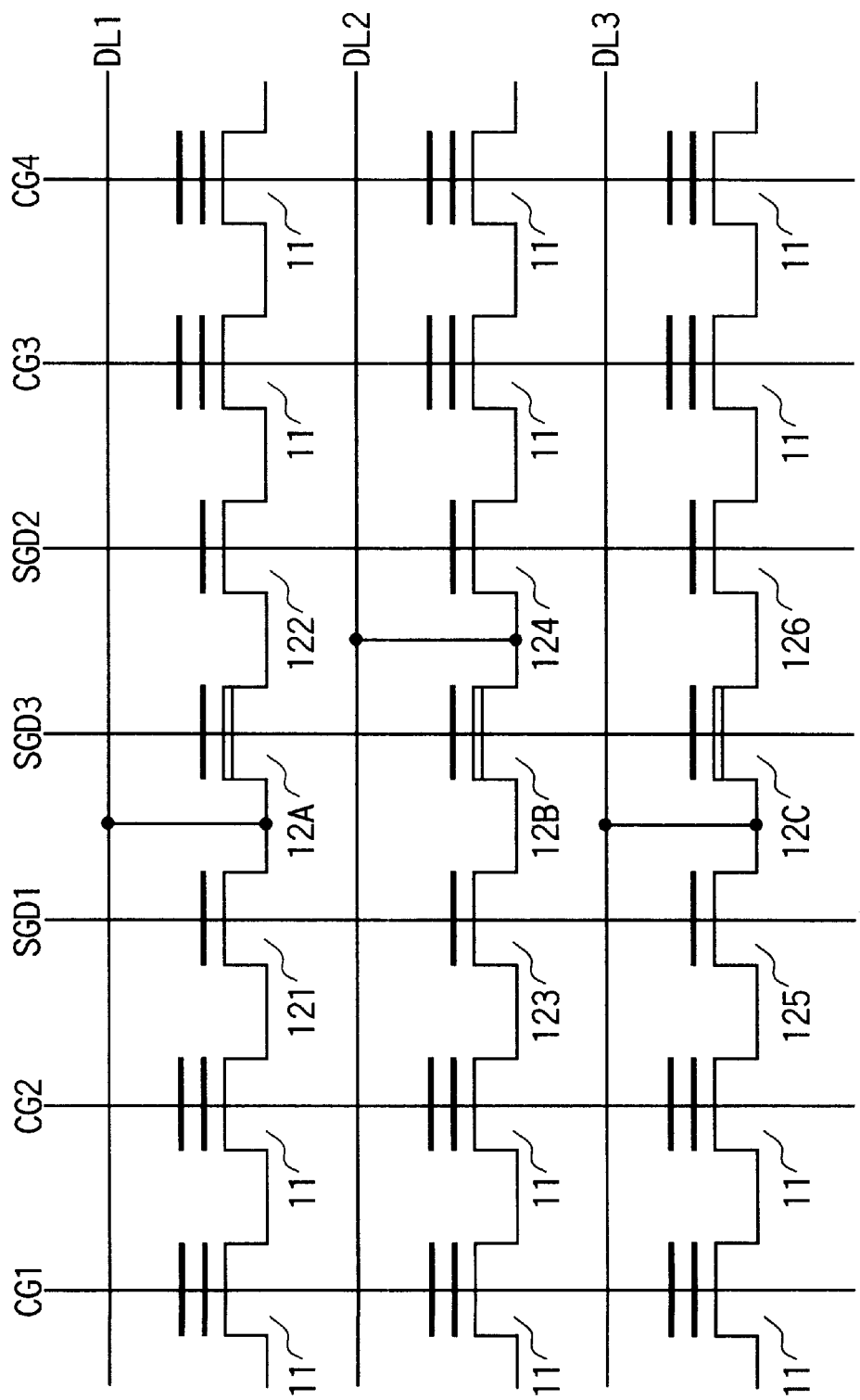
FIG. 24 is an equivalent circuit of a NAND type EEPROM, showing the second embodiment of the present invention.

FIG. 20 is a plan view of a layout of a NAND type EEPROM, showing a second embodiment of the present invention. FIG. 21 is a cross-section cut along a line XXI—XXI in FIG. 20. FIG. 22 is a cross-section cut along a line XXII—XXII in FIG. 20. FIG. 23 is a cross-section cut along a line XXIII—XXIII in FIG. 20. FIG. 24 shows an equivalent circuit of a NAND type EEPROM, showing the second embodiment of the present invention. In the figures, those portions which are the same as those shown in FIGS. 11 to 15 are referred to by same references, and explanation thereof will be omitted herefrom.

Surfaces of transistors 121, 122, 123, 124, 125, 126, . . . , 12A, 12B, 12C, . . . , and gate electrodes 5, 6, and 7 of memory cell transistors 11 are covered with a silicon nitride film SiN formed as an insulation film, for example, by an LPCVD method, and data line contacts CD1 to CD3 are subjected to patterning by photolithography. Thereafter, only the inter-layer insulating film 51 is selectively etched to form data line contacts CD1 to CD3 by a self-alignment manner. Note that the same advantages can be obtained by covering only the gate electrode side walls of the transistors 121, 122, 123, 124, 125, 126, . . . , 12A, 12B, 12C, . . . .

The equivalent circuit in FIG. 24 shows a circuit configuration in which source lines SL, selection gate lines SGS1, and transistors 12, and source line SL, selection gate lines SGS2 and source line SL are removed from the equivalent circuit shown in FIG. 15. Explanation of these components will be omitted herefrom.

Figure 25:
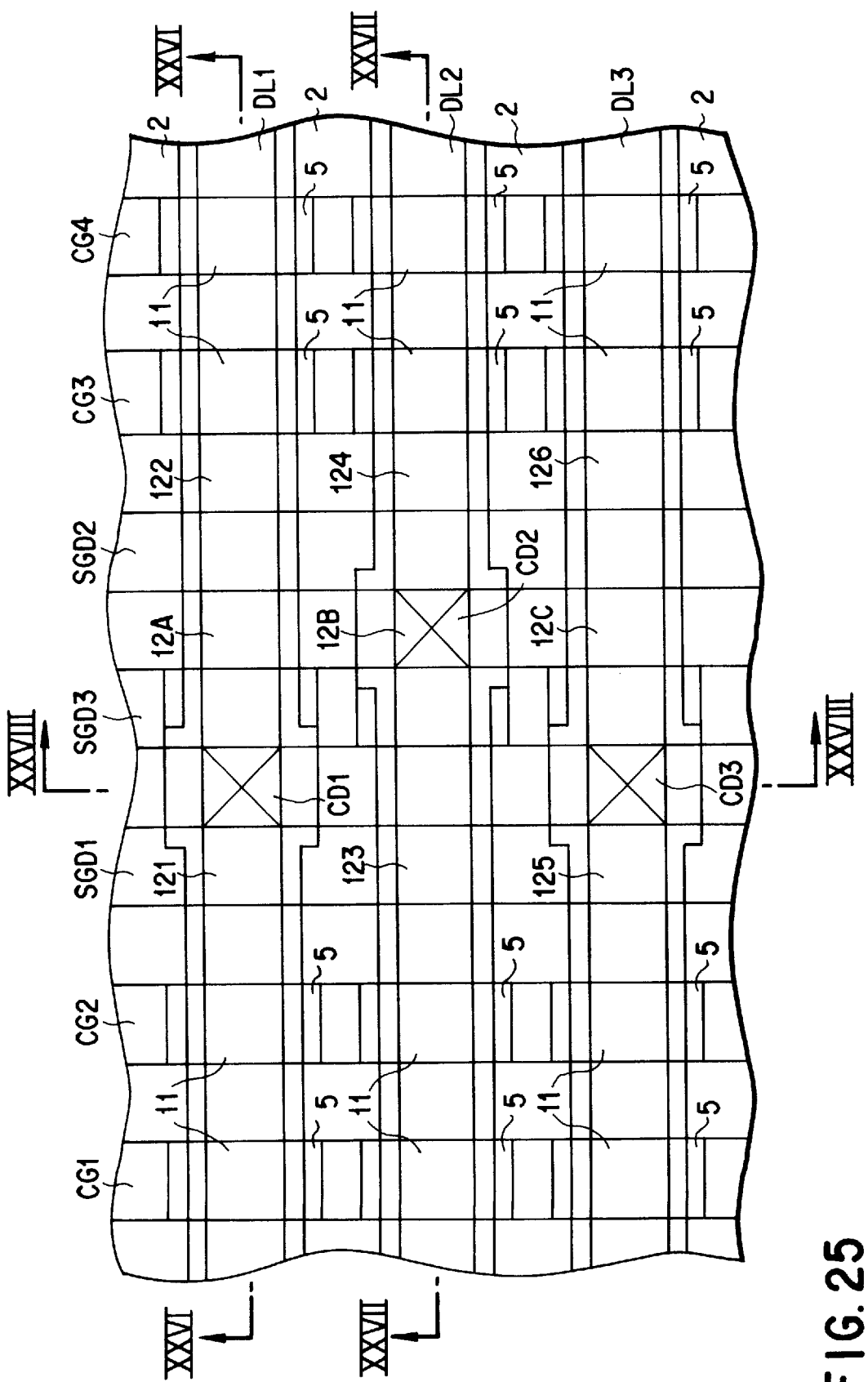
FIG. 25 is a plan view of a layout of a NAND type EEPROM, showing a third embodiment of the present invention.
Figure 26:
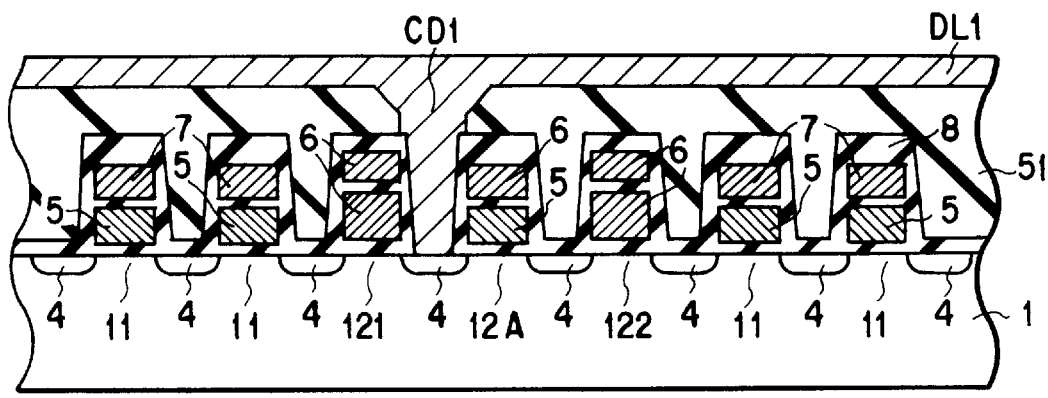
FIG. 26 is a cross-section cut along a line XXVI—XXVI in FIG. 25.
Figure 27:
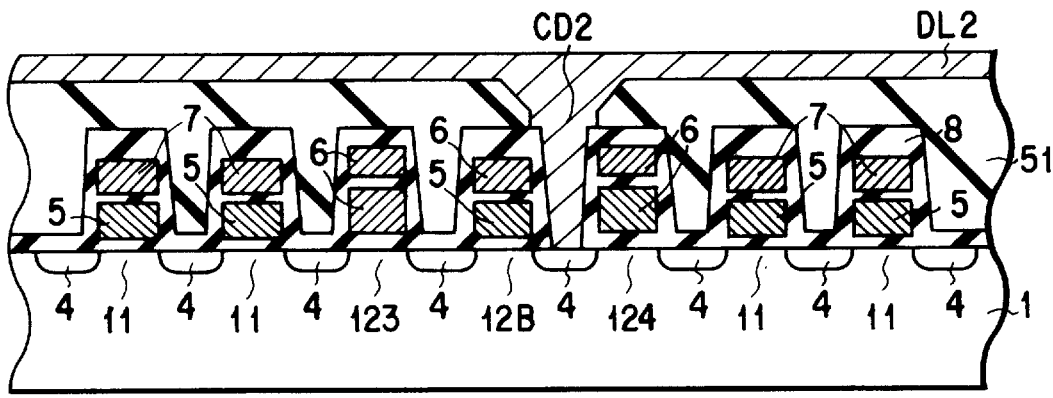
FIG. 27 is a cross-section cut along a line XXVII—XXVII in FIG. 26.
Figure 28:
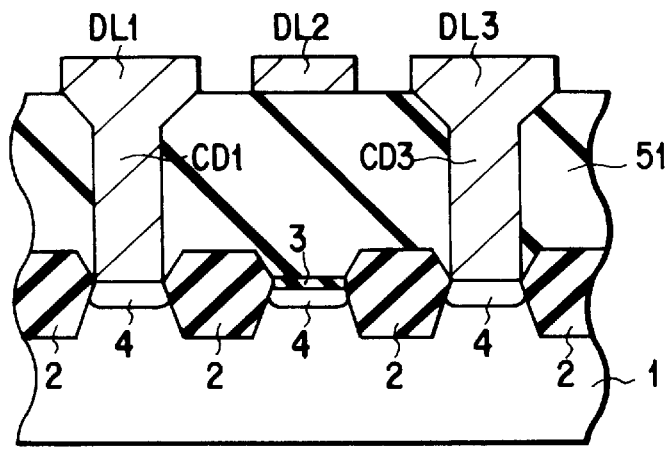
FIG. 28 is a cross-section cut along a line XXVII—XXVII in FIG. 26.
Figure 29:
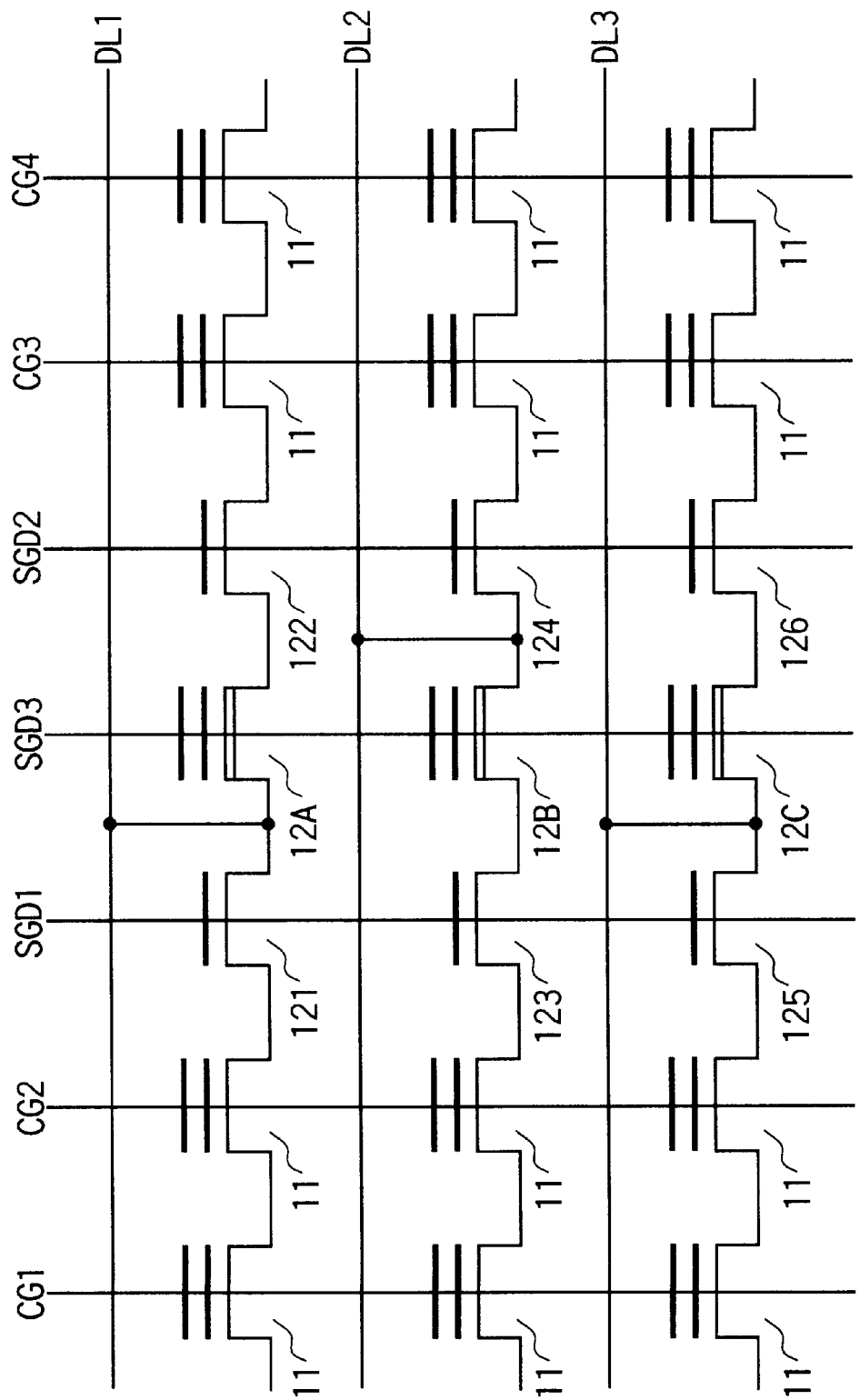
FIG. 29 is an equivalent circuit of a NAND type EEPROM, showing the third embodiment of the present invention.

FIG. 25 is a plan view of a layout of a NAND type EEPROM showing a third embodiment of the present invention. FIG. 26 is a cross-section cut along a line XXVI—XXVI in FIG. 25. FIG. 27 is a cross-section cut along a line XXVII—XXVII in FIG. 26. FIG. 28 is a cross-section cut along a line XXVIII—XXVIII in FIG. 26. FIG. 29 shows an equivalent circuit of a NAND type EEPROM, showing the third embodiment of the present invention. In the figures, those portions which are the same as those shown in FIGS. 1 to 15 are referred to by the same references, and explanation thereof will be omitted herefrom.

Transistors 12A, 12B, and 12C which use a third selection gate line SGD3 provided between a first selection gate line SGD1 and a second selection gate line SGD2, as gate electrodes may be transistors each consisting of a floating gate 5 as a charge storage layer and a gate 6. In this case, each of transistors 121 to 126 may be a transistor in which two gates 6 are layered with an insulating layer inserted therebetween. The two gates 6 are made of polysilicon and are electrically connected with each other.

Thus, in case of selection transistors 12A, 12B, and 12C each having a charge storage region, transistors having one same shape are disposed, so that excellent uniformity is obtained and manufacturing thereof is facilitated.

The equivalent circuit of a NAND type EEPROM in FIG. 29 showing the third embodiment of the present invention is similar to the NAND type EEPROM in FIG. 24 showing the second embodiment of the present invention. Those portions in FIG. 29 which are the same as those shown in FIG. 24 are referred to by the same references, and explanation thereof will be omitted herefrom.

Figure 30:
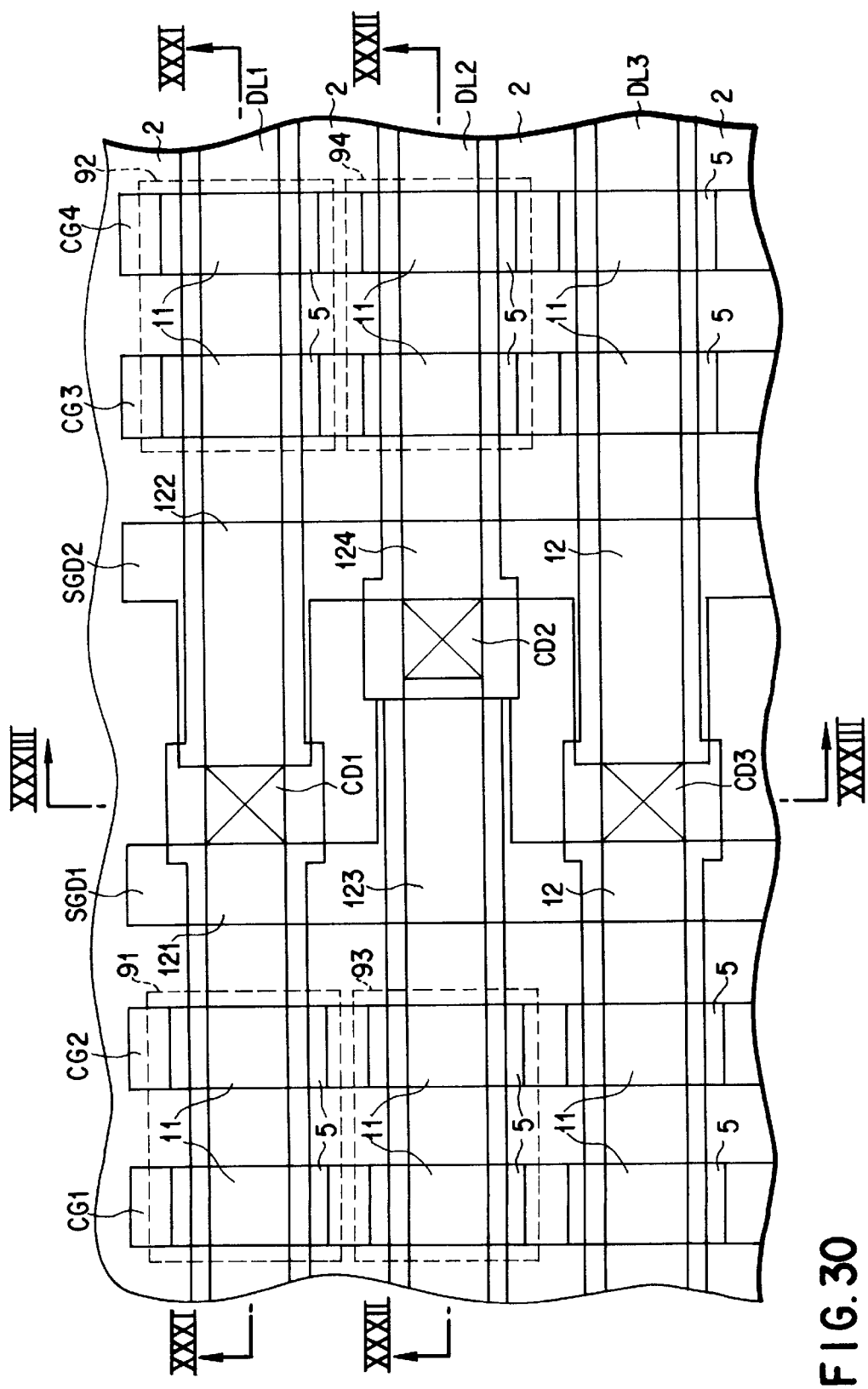
FIG. 30 is a plan view of a layout of a NAND type EEPROM, showing a fourth embodiment of the present invention.
Figure 31:
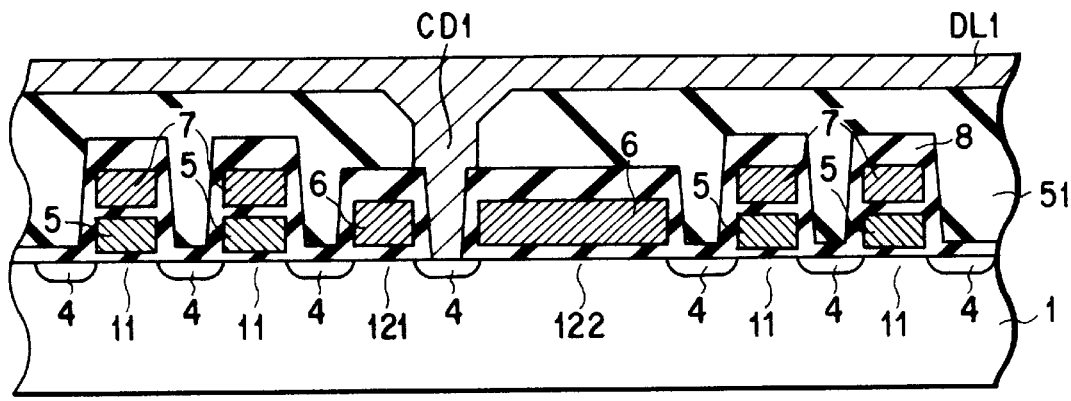
FIG. 31 is a cross-section cut along a line XXXI—XXXI in FIG. 30.
Figure 32:
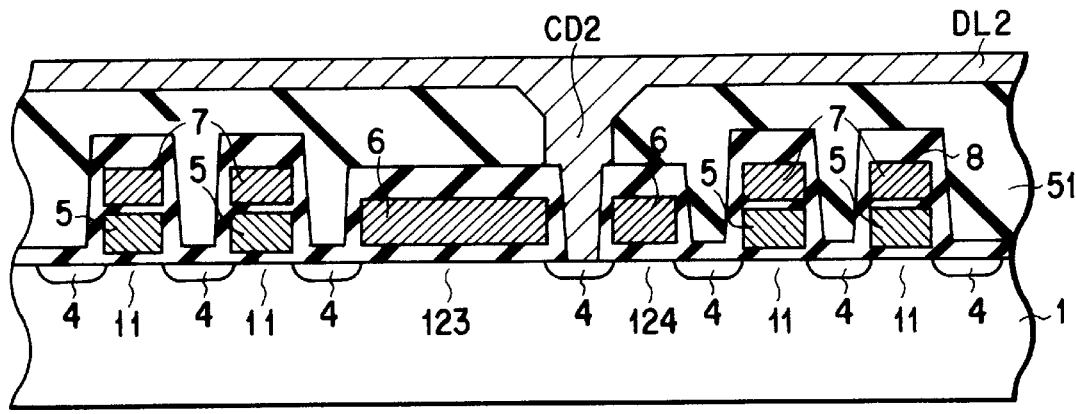
FIG. 32 is a cross-section cut along a line XXXII—XXXII in FIG. 30.
Figure 33:
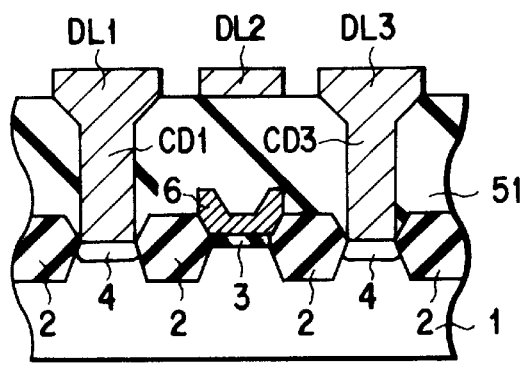
FIG. 33 is a cross-section cut along a line XXXIII—XXXIII in FIG. 30.
Figure 34:
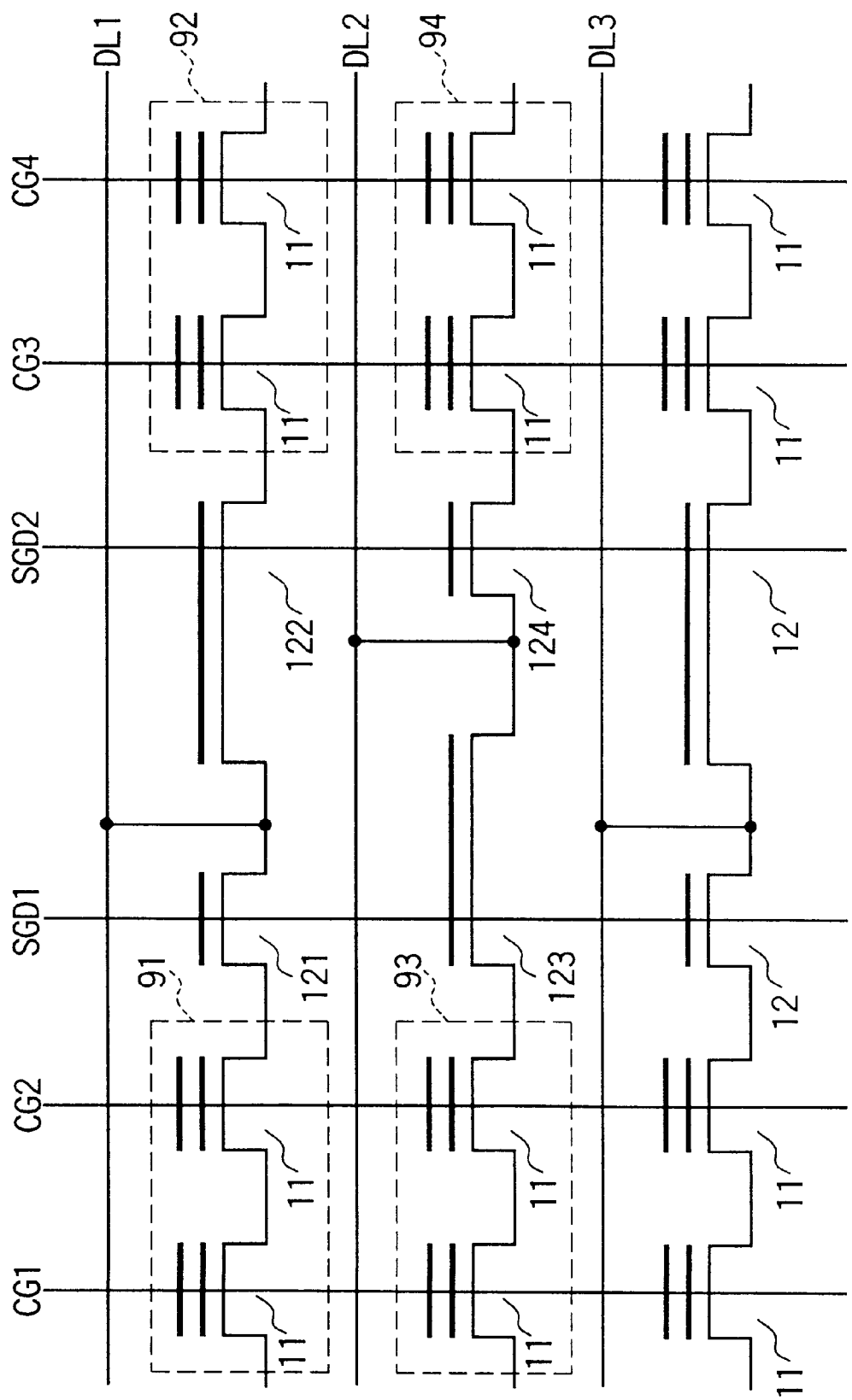
FIG. 34 shows an equivalent circuit of a NAND type EEPROM, showing the fourth embodiment of the present invention.

FIG. 30 is a plan view of a layout of a NAND type EEPROM, showing a fourth embodiment of the present invention. FIG. 31 is a cross-section cut along a line XXXI—XXXI in FIG. 30. FIG. 32 is a cross-section cut along a line XXXII—XXXII in FIG. 30. FIG. 33 is a cross-section cut along a line XXXIII—XXXIII in FIG. 30. FIG. 34 shows an equivalent circuit of a NAND type EEPROM, showing the fourth embodiment of the present invention.

The gate electrode of a transistor 121 connected to a first NAND type memory cell row 91 and the gate electrode of a transistor 123 connected to a third NAND type memory cell row 93 are connected together to a selection gate line SGD1. The gate 6 of the transistor 121 is formed to have a gate length shorter than the gate length of the gate 6 of the transistor 123.

In addition, the gate electrode of a transistor 122 connected to a second NAND type memory cell row 92 and the gate electrode of a transistor 124 connected to a fourth NAND type memory cell row 94 are connected together to a selection gate line SGD2.

The gate 6 of the transistor 122 is formed to have a gate length longer than the gate length of the gate 6 of the transistor 124. Therefore, the distance between adjacent data line contacts CD1 and CD2 can be widened, so that short-circuiting of wires can be prevented.

The equivalent circuit of a NAND type EEPROM in FIG. 34 showing the fourth embodiment of the present invention is modified to the NAND type EEPROM in FIG. 29 showing the third embodiment of the present invention. Those portions in FIG. 34 which are the same as those shown in FIG. 29 are referred to by the same references, and explanation thereof will be omitted herefrom.

Figure 35:
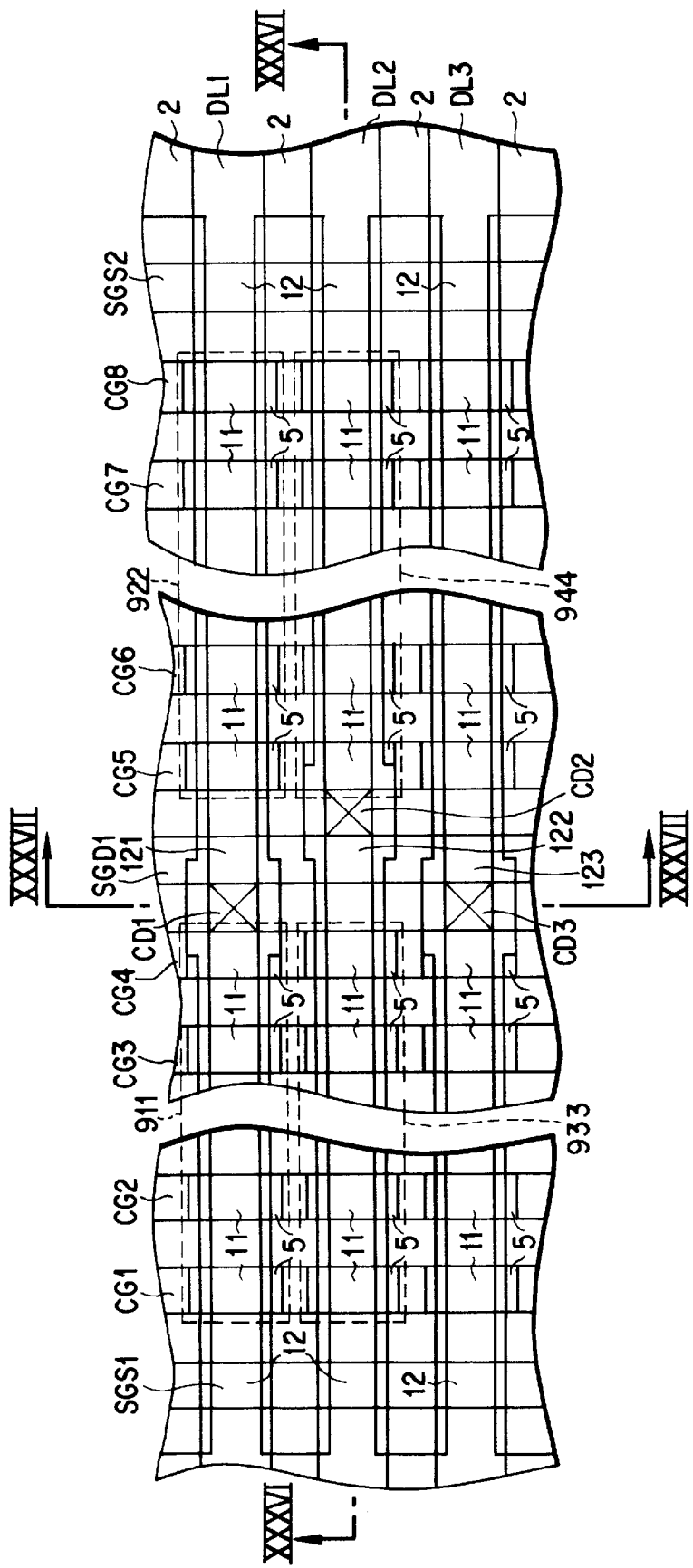
FIG. 35 is a plan view of a layout of a NAND type EEPROM, showing a fifth embodiment of the present invention.
Figure 36:
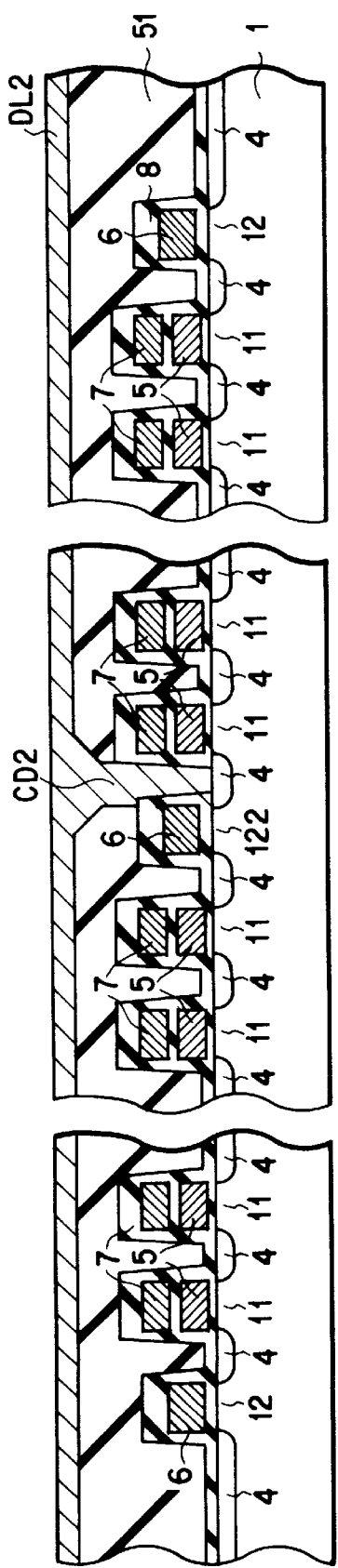
FIG. 36 is a cross-section cut along a line XXXVI—XXXVI in FIG. 35.
Figure 37:
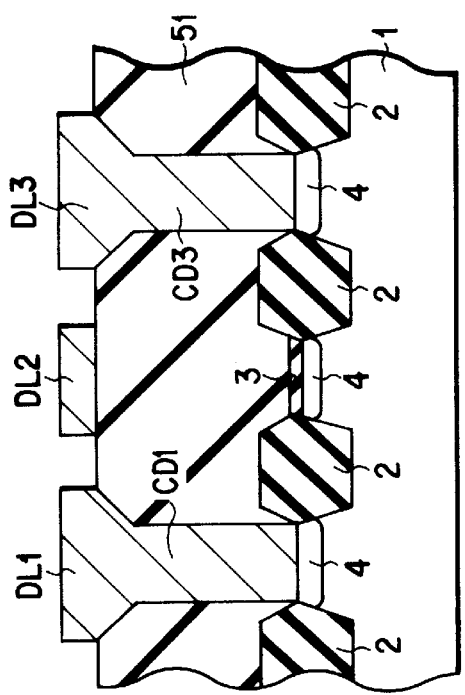
FIG. 37 is a cross-section cut along a line XXXVII—XXXVII in FIG. 35.

FIG. 35 is a plan view of a layout of a NAND type EEPROM, showing a fifth embodiment of the present invention. FIG. 36 is a cross-section cut along a line XXXVI—XXXVI in FIG. 35. FIG. 37 is a cross-section cut along a line XXXVII—XXXVII in FIG. 35. FIG. 37 shows an equivalent circuit of a NAND type EEPROM, showing the fifth embodiment of the present invention.

A plurality of memory cell transistors 11 each having a charge storage region are connected in series with each other to form each of a first NAND type memory cell row 911, a second NAND type memory cell row 922, a third NAND type memory cell row 933, a fourth NAND type memory cell row 944, . . . .

The third NAND type memory cell row 933 and the fourth NAND type memory cell row 944 are formed to be respectively adjacent to the first NAND type memory cell row 911 and the second NAND type memory cell row 922, with element separation regions 2 inserted therebetween.

A first transistor 121 is formed between the first memory cell row 911 and the second memory cell row 922.

A data line contact CD1 connected to a data line DL1 is formed between the first memory cell 911 and the first transistor 121. A second transistor 122 is connected between the third memory cell row 933 and the fourth memory cell row 944. A data line contact CD2 is formed between the second transistor 122 and the fourth memory cell row 944.

Gate electrodes of the first transistor 121 and the second transistor 122 are connected together to a first selection gate line SGD1.

Thus, positions of adjacent data line contacts CD1, CD2, and CD3 are shifted from each other such that the first selection gate line SGD1 is sandwiched therebetween. The distances between the data line contacts CD1, CD2, and CD3 are widened, so that short-circuiting of wires can be prevented.

Figure 38:
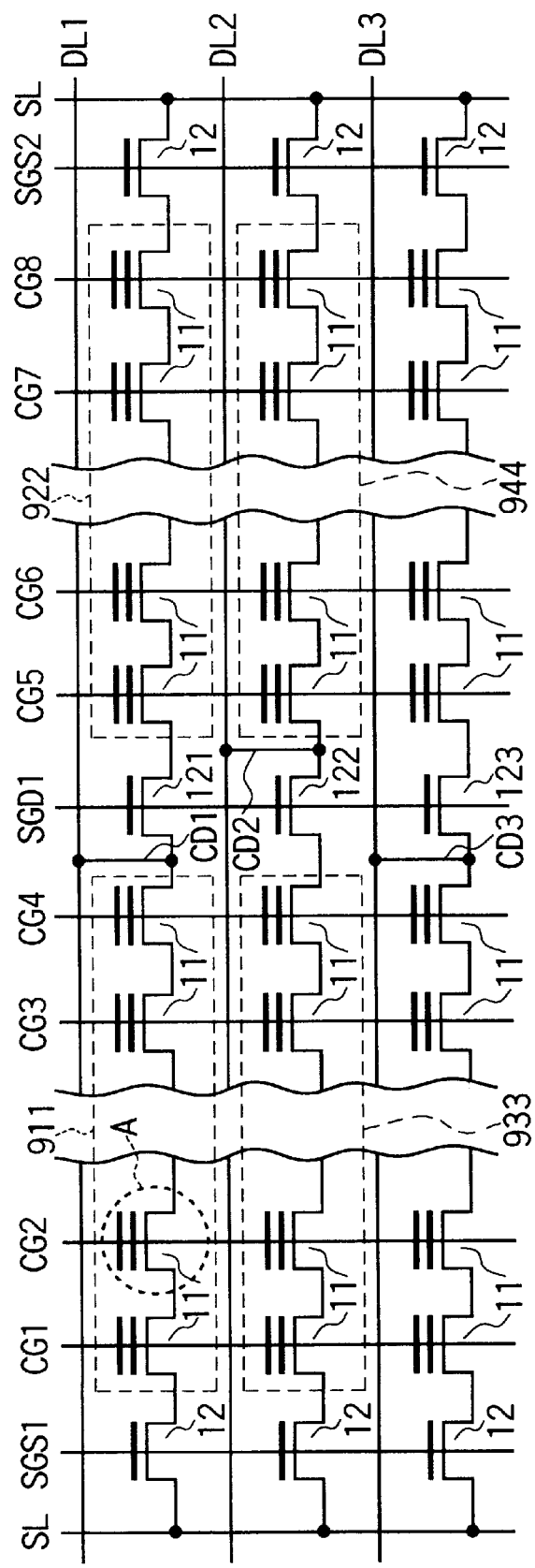
FIG. 38 is an equivalent circuit, showing the fifth embodiment of the present invention.

In the equivalent circuit shown in FIG. 38, the polarities of the drain and source of the transistors 11, 12, 121, and 122 can be inverted so that the data lines DL1, DL2, and DL3 and the source line SL are replaced with each other.

As is apparent from the equivalent circuit shown in FIG. 38, by shifting the positions of adjacent data line contacts CD1, CD2, and CD3 from each other, the distances between the data line contacts can be widened, so that short-circuiting of wires can be prevented.

Next, operation of a NAND type EEPROM showing the fifth embodiment described above will be explained below.

FIG. 39 shows a voltage relationship between respective portions during operation. In the following, a voltage relationship will explained, supposing that the memory cell transistor selected during writing or reading is a memory cell transistor A as shown in FIG. 38, for conveniences of explanation.

At first, data erasure is performed at once (in form of batch-erasure) on all memory cell transistors 11 in a selected first NAND type memory cell row 911. In this case, all control gate lines CG1, CG2, CG3, and CG4 in the first NAND type memory cell row 911 are set to 0V, and an erasure voltage Vppe is applied to a n-type substrate 1, a p-type well, and selection gate lines SGD1, SGS1, and SGS2. In this state, electrons are discharged to the p-type well from a floating gate 5 by a tunnel current, so that the threshold value of the memory cell transistor A moves in a negative direction, to form an erasure state.

Data writing is selectively performed for every memory cell transistor 11. A write voltage Vppw is applied to the control gate line CG2 of the selected memory cell transistor A described above, and a middle potential Vm is applied to the other control gate lines CG1, CG3, and CG4.

The p-type well is applied with 0V. The data line DL1 connected to the selected memory cell transistor A is applied with 0V, and the other data lines DL2 and DL3 are applied with a middle potential Vm. In this manner, electrons are injected into a floating gate 5 of the selected memory cell transistor A, and the threshold value of the memory cell transistor A is shifted in a positive direction, to form a writing state.

In data reading, the control gate line CG2 connected to the selected memory cell transistor A is applied with 0V, and the other control gate lines CG1, CG3, and CG4 and the selection gate line SGS1 are applied with a power source potential Vcc. A read voltage Vcc is applied to the data line DL1. In this manner, a determination is made as to data written in the memory cell transistor A, depending on whether or not a current flows from the data line DL1 through the memory cell transistor A to the source line SL.

Figure 40:
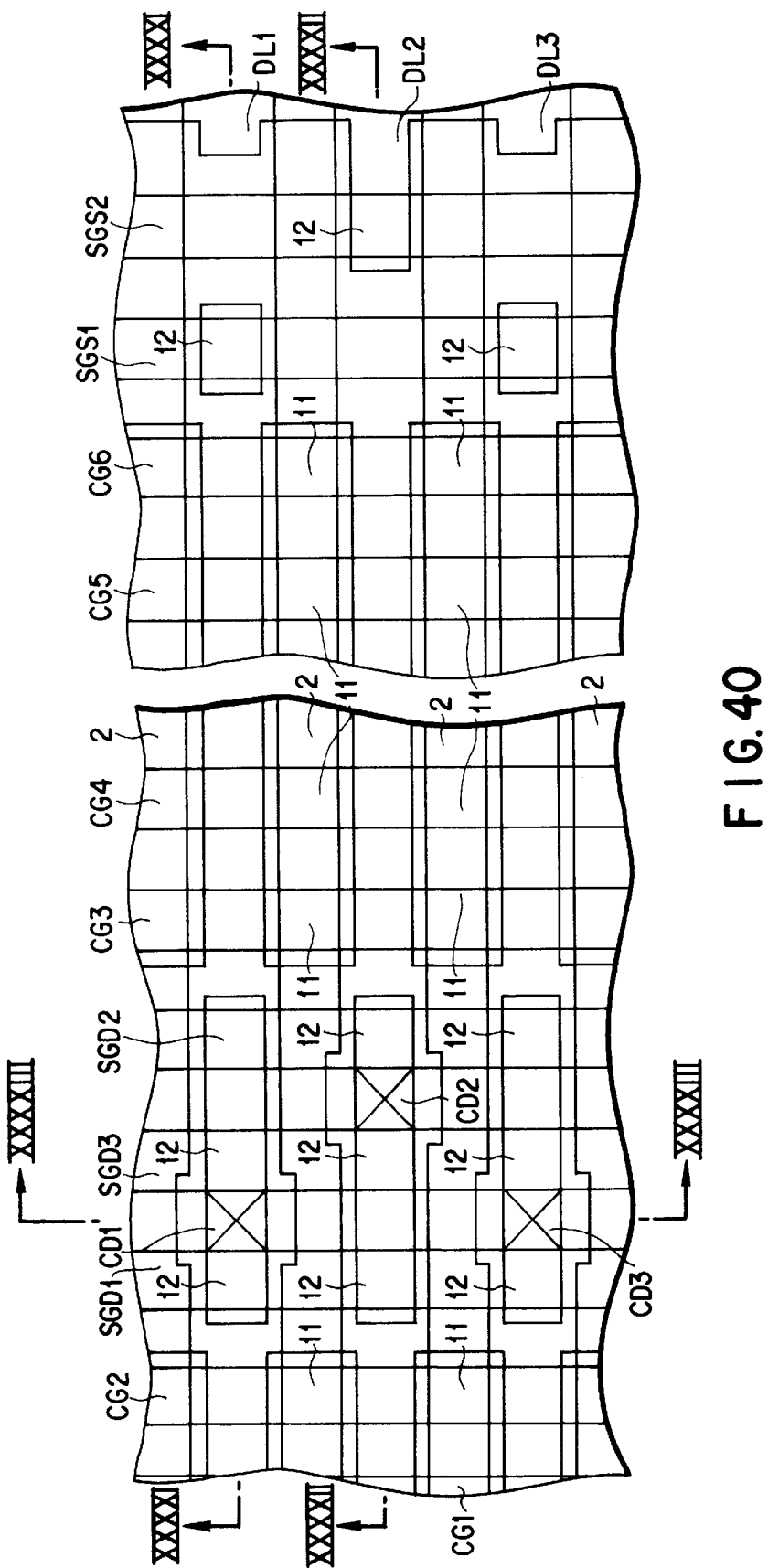
FIG. 40 is a plan view of a layout of an EEPROM, showing a sixth embodiment of the present invention.
Figure 41:
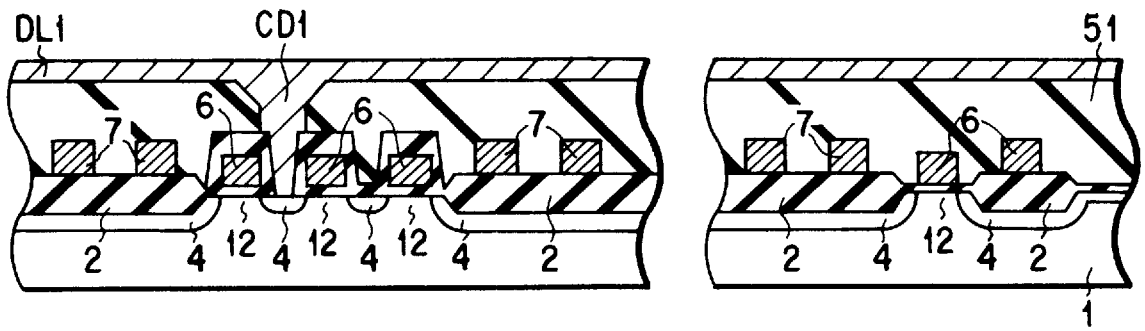
FIG. 41 is a cross-section cut along a line XXXXI–XXXXI in FIG. 40.
Figure 42:
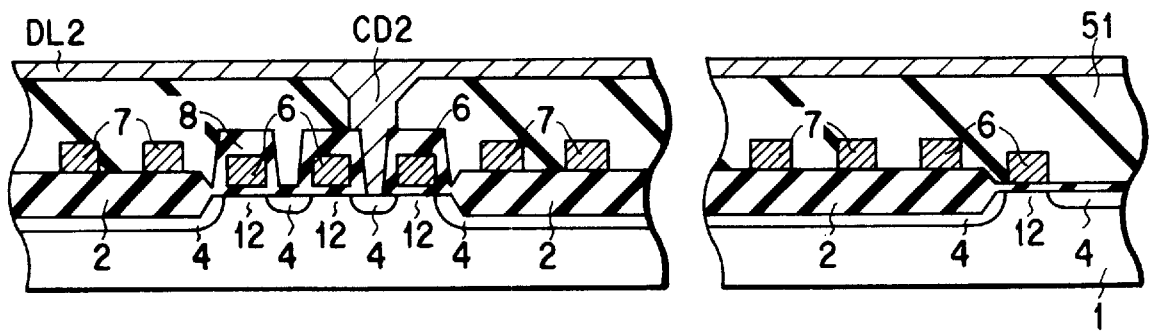
FIG. 42 is a cross-section cut along a line XXXXII—XXXXII in FIG. 40.
Figure 43:
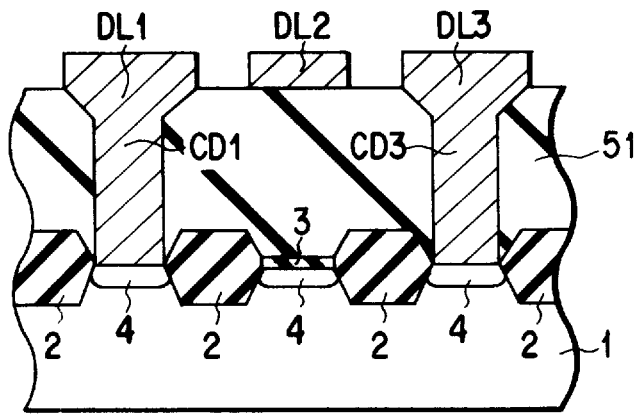
FIG. 43 is a cross-section cut along a line XXXXIII—XXXXIII in FIG. 40.

FIG. 40 is a plan view of a layout of an EEPROM, showing a sixth embodiment of the present invention. FIG. 41 is a cross-section cut along a line XXXXI—XXXXI in FIG. 40. FIG. 42 is a cross-section cut along a line XXXXII—XXXXII in FIG. 40. FIG. 43 is a cross-section cut along a line XXXXIII—XXXXIII in FIG. 40.

Figure 44:
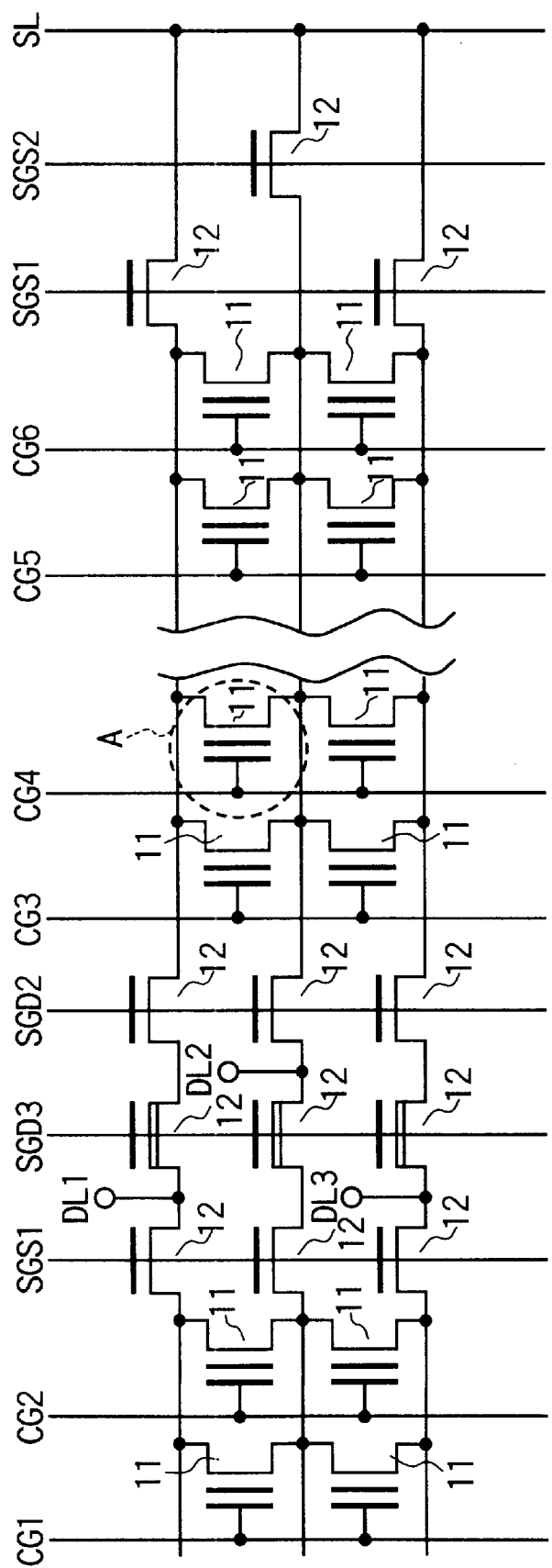
FIG. 44 shows an equivalent circuit of an EEPROM, showing the sixth embodiment of the present invention.

FIG. 44 shows an equivalent circuit of an EEPROM, showing the sixth embodiment of the present invention. In this equivalent circuit, those portions which are the same as those shown in FIG. 15 are referred to by the same references, and explanation thereof will be omitted herefrom.

The present embodiment shows a case in which the present invention is applied to a virtual ground array cell in which sources and drains of memory cell transistors 11 are used in common.

In this embodiment, also, by shifting positions of adjacent data line contacts CD1, CD2, and CD3 from each other so as to sandwich a selection gate line SGD3 therebetween, the distances between the adjacent data line contacts are widened, so that short-circuiting of wires can be prevented.

Next, operation of an EEPROM according to the embodiment described above will be explained below.

FIG. 45 shows a voltage relationship between respective portions during operation. The voltage relationship is obtained, supposing that the memory cell transistor selected during writing and reading is a memory cell transistor A shown in FIG. 44.

At first, data erasure is carried out by applying a voltage 15V (or 3V) to selection gate lines SGD2, SGS1, and SGS2 and a voltage 15V to control gate lines CG3, CG4, CG5, and CG6, to inject electrons into a floating gate of the memory cell transistor 11 from a P-type well. Data writing is selectively performed for every memory cell transistor 11.

The control gate line CG4 of the selected memory cell transistor A is applied with a voltage −10V, and a voltage 5V is applied to-a data line DL1, selection gate lines SGD2 and SGS2, to discharge electrons from the floating gate of the memory cell transistor A to the drain.

In data reading, detection is performed by applying a voltage 3V to the control gate line CG4 connected to the selected memory cell transistor A, the data line DL1, and the selection gate lines SGD2 and SGS2, to make a current flow from the data line DL1 through the memory cell transistor A to the source line SL.

Figure 46:
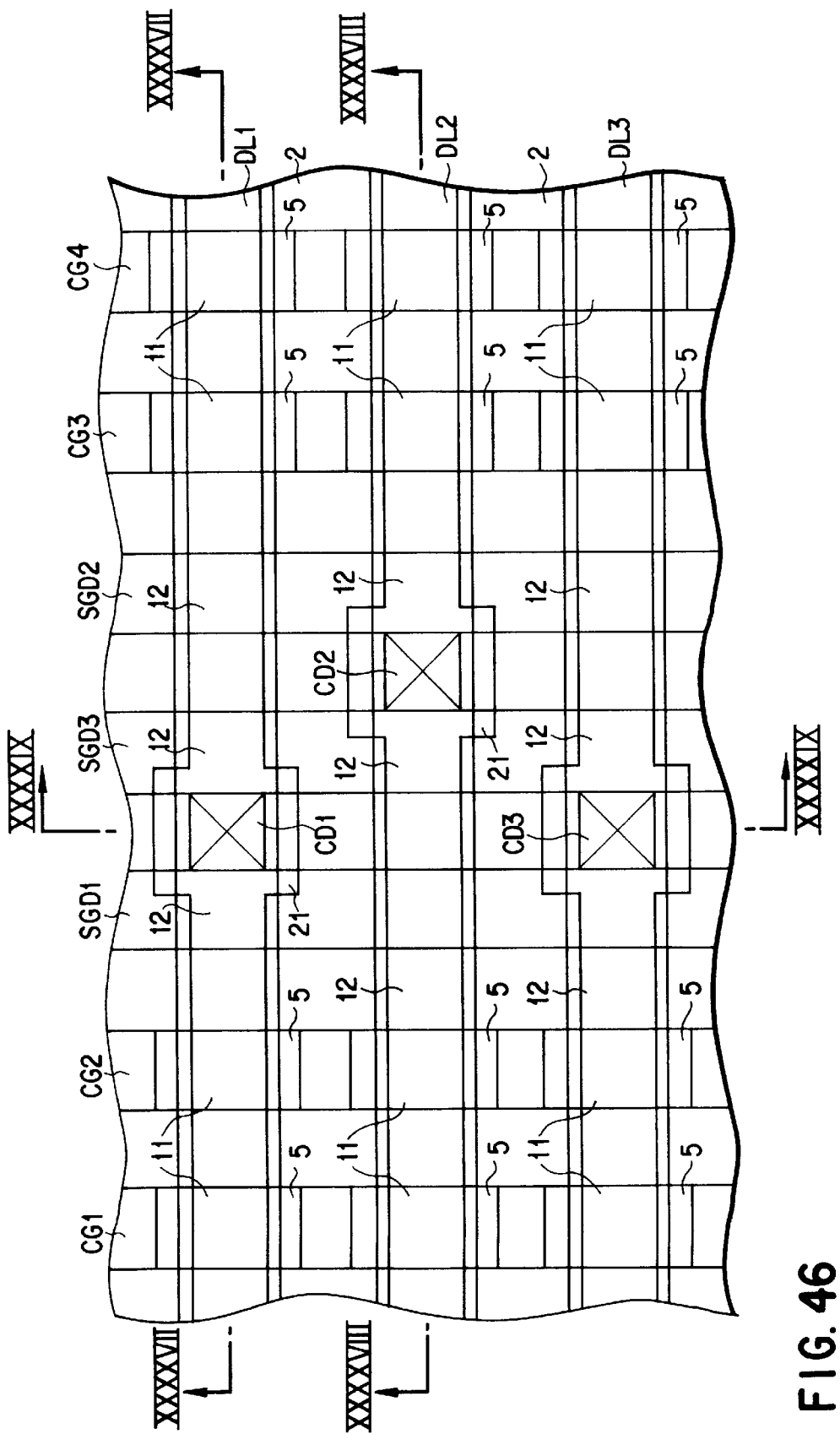
FIG. 46 is a plan view of an EEPROM, showing a seventh embodiment of the present invention.

FIG. 46 is a plan view of a layout of an EEPROM, showing a seventh embodiment of the present invention. FIG. 47 is a cross-section cut along a line XXXXVII—XXXXVII in FIG. 46. FIG. 48 is a cross-section cut along a line XXXXVIII—XXXXVIII in FIG. 46. FIG. 49 is a cross-section cut along a line XXXXIX—XXXXIX in FIG. 46.

In the figures, those portions which are the same as those shown in FIGS. 11 to 13 are referred to by the same references, and explanation thereof will be omitted herefrom.

Specifically, the NAND type EEPROM according to the second embodiment of the present invention shown in FIGS. 20 to 24 is arranged such that the width of the element region 21 in the vicinity below the data line contacts CD1 to CD3 is widened. Thus, it is possible to widen the width of the element region 21 without much narrowing the width of the element separation region 2. By widening the width of the element region 21, advantages are obtained in manufacturing steps and the present embodiment is suitable for high integration.

Figure 50:
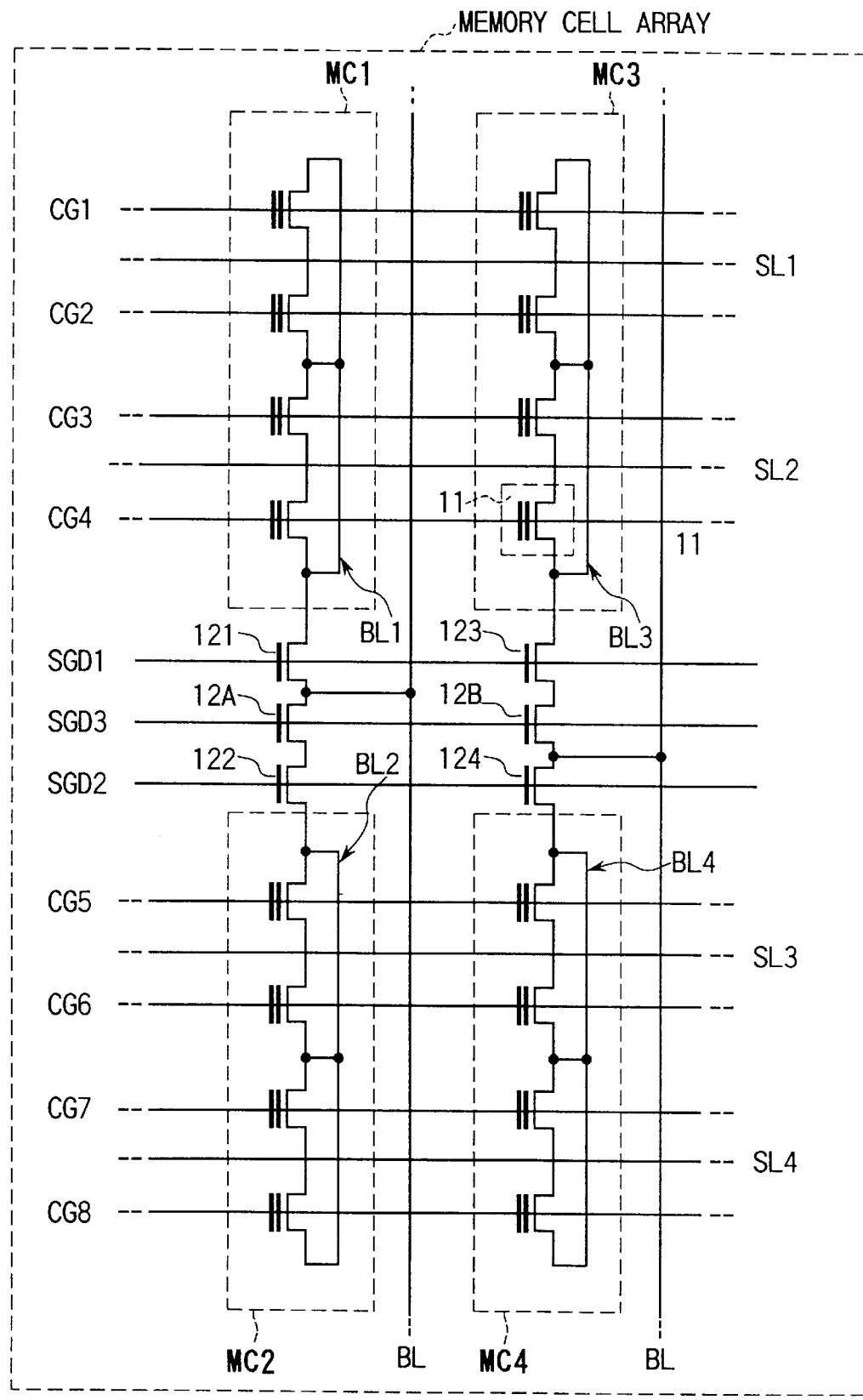
FIG. 50 shows an equivalent circuit of a memory cell array of a DINOR (Divided NOR) type EEPROM, showing an eighth embodiment of the present invention.

FIG. 50 shows an equivalent circuit of a memory cell array of a DINOR (Divided NOR) type EEPROM, showing an eighth embodiment of the present invention. In this figure, those portions which are the same as those shown in FIGS. 11 to 15 are referred to by the same references, and explanation thereof will be omitted herefrom.

In FIG. 50, in the DINOR type EEPROM, a first memory cell row MC1 is constructed by connecting a plurality of memory cell transistors 11 in parallel between a first sub-bit line BL1 and source lines SL1 and SL2.

A second memory cell row MC2 is constructed by connecting a plurality of memory cell transistors 11 in parallel between a second sub-bit line BL2 and source lines SL3 and SL4.

A third memory cell row MC3 is constructed by connecting a plurality of memory cell transistors 11 in parallel between a third sub-bit line BL3 and the source lines SL1 and SL2.

A fourth memory cell row MC4 is constructed by connecting a plurality of memory cell transistors 11 in parallel between a fourth sub-bit line BL4 and the source lines SL3 and SL4.

The sub-bit line BL1 of the first memory cell row MC1 is connected by a first data line contact CD1 to a bit line 13L as a data line through a first transistor 12I.

The sub-bit line BL2 of the second memory cell row MC2 is connected to a second transistor 12Z. The sub-bit line BL3 of the third memory cell row MC3 is connected to a third transistor 12Z, and the sub-bit line BL4 of the fourth memory cell row MC4 is connected by a second data line contact CD2 to a bit line BL as a data line through a fourth transistor 12Z.

A fifth transistor 12A is connected between the first data line contact CD1 and the second transistor 12Z. A sixth transistor 12B is connected between the second data line contact CD2 and the third transistor 12Z.

A third selection gate line SGD3, which connects gate electrodes of the fifth transistor 12A and the sixth transistor 12B to each other, is formed between a first selection gate line SGD1, which connects gate electrodes of the first transistor 12I and the third transistor 12Z, and a second selection gate line, which connects gate electrodes of the second transistor 12Z and the fourth transistor 12Z. Thus, by providing a third selection gate line SGD3 for connecting gate electrodes of selection transistors 12A and 12B, the distance between the data line contacts CD1 and CD2 can be widened, and therefore, it is possible to prevent short-circuiting of wires between bit lines BL, which may cause an error operation.

The above explanation has been made with respect to the same EEPROM as that in the first embodiment of the present invention except that the structure of each memory cell row is changed to a DINOR type structure. However, the other embodiments of the present invention can be applied to a DINOR type EEPROM, in the same manner as described above. For example, each of the transistors 12A and 12B may be arranged so as to have a charge storage region, or the channel length of the gate electrodes of the transistors 122 and 123 may be formed to be long in place of providing a selection gate line SGD3.

Figure 51:
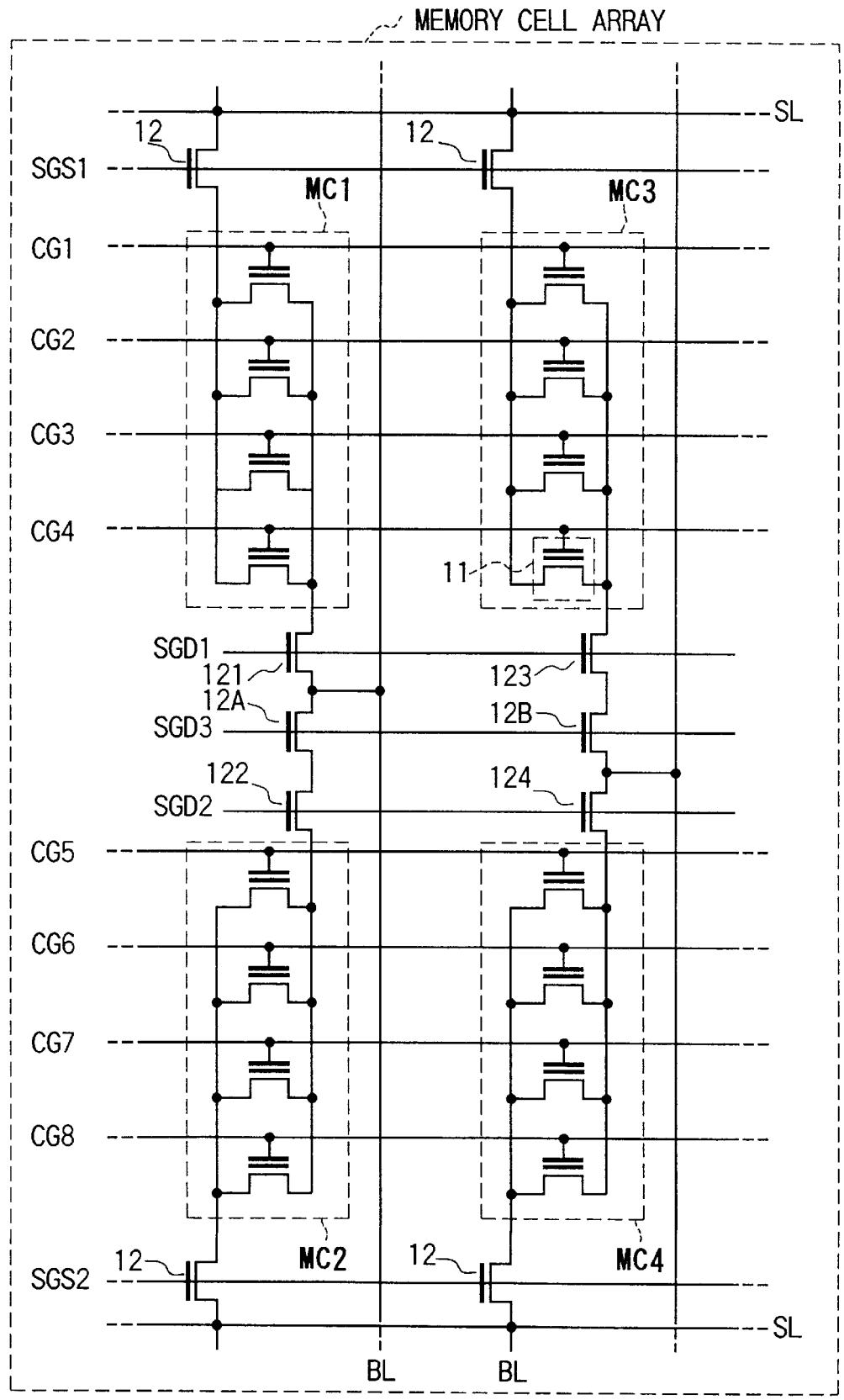
FIG. 51 shows an equivalent circuit of a memory cell array of an AND type EEPROM, showing a ninth embodiment of the present invention.

FIG. 51 shows an equivalent circuit of a memory cell array of an AND type EEPROM, showing a ninth embodiment of the present invention. In this figure, those portions which are the same as those shown in FIGS. 11 to 15 are referred to by the same references, and explanation thereof will be omitted herefrom.

As shown in FIG. 51, in an AND type EEPROM, each of first to fourth memory cell rows MC1 to MC4 is constructed by connecting four memory cell transistors 11 in parallel with each other.

In the above mentioned embodiment, AND cell is constructed by four transistors connected in parallel each other. However, any given number of transistors may be used. The first memory cell row MC1 is connected by a first data line contact CD1 to a bit line BL as a data line through a first transistor 121, and the second memory cell row MC2 is connected to a second transistor 122. The third memory cell row MC3 is connected to a third transistor 123, and the fourth memory cell row MC4 is connected by a second data line contact CD2 to a bit line BL as a data line through a fourth transistor 124.

A fifth transistor 12A is connected between the first data line contact CD1 and the second transistor 122. A sixth transistor 12B is connected between the second data line contact CD2 and the third transistor 123.

A third selection gate line SGD3, which connects gate electrodes of the fifth transistor 12A and the sixth transistor 12B to each other, is formed between a first selection gate line SGD1, which connects gate electrodes of the first transistor 121 and the third transistor 123, and a second selection gate line, which connects gate electrodes of the second transistor 122 and the fourth transistor 124.

Thus, by providing a third selection gate line SGD3 for connecting gate electrodes of selection transistors 12A and 12B, the distance between the data line contacts CD1 and CD2 can be widened, and therefore, it is possible to prevent short-circuiting of wires between bit lines BL, which may cause an error operation.

The above explanation has been made with respect to the same EEPROM as that in the first embodiment of the present invention except that the structure of each memory cell row is changed to an AND type structure. However, the other embodiments of the present invention can be applied to an AND type EEPROM, in the same manner as described above. For example, each of the transistors 12A and 12B may be arranged so as to have a charge storage region, or the channel length of the gate electrodes of the transistors 122 and 123 may be formed to be long in place of providing a selection gate line SGD3.

As has been described above, in any of the above embodiments, the distance between adjacent contacts can be widened, and it is possible to prevent short-circuiting of contacts and data lines which may cause an error operation or punch-through in element regions, while maintaining the flatness.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalent.

I claim:
1. A semiconductor memory device comprising:
 a memory cell array including a plurality of memory cell rows and a plurality of transistors in which a first memory cell row having at least a memory cell transistor;
 a first transistor connected to either a drain side or a source side of the first memory cell row;
 a second memory cell row having at least a memory cell transistor;
 a second transistor connected to either a drain side or a source side of the second memory cell row;
 a third memory cell row having at least a memory cell transistor;
 a third transistor connected to either a drain side or a source side of the third memory cell row;
 a fourth memory cell row having at least a memory cell transistor; and
 a fourth transistor connected to either a drain side or a source side of the fourth memory cell row, wherein the first and second transistors are connected to either a data line or a source line through a first contact common to both the first and second transistors, and form a first memory cell group, the third and fourth transistors are connected to either a data line or a source line through a second contact common to both the third and fourth transistors, and form a second memory cell group, gate electrodes of the first and third transistors are connected in common to a first gate line, gate electrodes of the second and fourth transistors are connected in common to a second gate line, and said first and second memory cell groups are separated from each other such that an element separation region is inserted between said first and second memory cell groups; and
 a third gate line provided at a space between the first and second gate lines, the first contact being formed between the first and third gate lines, and the second contact being formed between the second and third gate lines.

2. A semiconductor memory device according to claim 1, wherein the memory cell transistors of the memory cell rows are formed in a structure in which a first conductive layer is formed above the semiconductor substrate with a first insulating film inserted therebetween and a second conductive layer is formed above the first conductive layer with a second insulating film inserted therebetween, and a plurality of the memory cell transistors are connected in parallel or in series, and form at least one selected from the group consisting of a DINOR type non-volatile memory cell, AND type non-volatile memory cell and a NAND type non-volatile memory cell.

3. A semiconductor memory device according to claim 1, wherein said first and second memory cell groups are arranged side by side each other with the element separation region inserted therebetween.

4. A semiconductor memory device according to claim 1, wherein an element region provided under said first and second contacts has a wider width than that of said memory cell row.

5. A semiconductor memory device comprising: a memory cell array including a plurality of memory cell rows and a plurality of transistors in which a first memory cell row having at least a memory cell transistor;
   a first transistor connected to either a drain side or a source side of the first memory cell row;
   a second memory cell row having at least a memory cell transistor;
   a second transistor connected to either a drain side or a source side of the second memory cell row;
   a third memory cell row having at least a memory cell transistor;
   a third transistor connected to either a drain side or a source side of the third memory cell row;
   a fourth memory cell row having a memory cell transistor; and
   a fourth transistor connected whether a drain side or a source side of the fourth memory cell row, wherein the first and second transistors are connected to either a data line or a source line through a first contact common to both the first and second transistors, and form a first memory cell group, the third and fourth transistors are connected to either a data line or a source line through a second contact common to both the third and fourth transistors, and form a second memory cell group, gate electrodes of the first and third transistors are connected in common to a first gate line, gate electrodes of the second and fourth transistors being connected in common to a second gate line, and said first and second memory cell groups are separated from each other such that an element separation region is inserted between said first and second memory cell groups;
   a first spacing element connected between the first contact and the second transistor; and
   a second spacing element connected between the second contact and the third transistor.

6. A semiconductor memory device according to claim 5, wherein the memory cell transistors of the memory cell rows are formed in a structure in which a first conductive layer is formed above the semiconductor substrate with a first insulating film inserted therebetween and a second conductive layer is formed above the first conductive layer with a second insulating film inserted therebetween, and a plurality of the memory cell transistors are connected in parallel or in series, and form at least one selected from the group consisting of a DINOR type non-volatile memory cell, AND type non-volatile memory cell and a NAND type non-volatile memory cell.

7. A semiconductor memory device according to claim 5, wherein the first spacing element comprises a fifth transistor and the second spacing element comprises a sixth transistor.

8. A semiconductor memory device according to claim 7, wherein at least one of the fifth and sixth transistors is a depression type transistor.

9. A semiconductor memory device according to claim 7, wherein at least one of the fifth and sixth transistors is an enhancement type transistor which is rendered conductive by biasing a gate electrode at a high level.

10. A semiconductor memory device according to claim 7, wherein each of the fifth and sixth transistors is formed in a structure in which a first conductive layer is formed above a semiconductor substrate with a first insulating film inserted therebetween and a second conductive layer is formed above the first conductive layer with a second insulating film inserted therebetween.

11. A semiconductor memory device according to claim 7, wherein each of gate electrodes of the first, second, third, fourth, fifth, and sixth transistors has a side wall insulating film and the first and second contacts are formed in a self-alignment manner with respect to the gate electrodes.

12. A semiconductor memory device according to claim 7, wherein said fifth and sixth transistors are connected in common to a third gate line.

13. A semiconductor memory device according to claim 5, wherein said first and second memory cell groups are arranged side by side each other with the element separation region inserted therebetween.

14. A semiconductor memory device according to claim 5, wherein an element region provided under said first and second contacts has a wider width than that of said memory cell row.

15. A semiconductor memory device comprising:
   a memory cell array including a plurality of memory cell rows and a plurality of transistors in which a first memory cell row having at least a memory cell transistor;
   a first transistor connected to either a drain side or a source side of the first memory cell row;
   a second memory cell row having at least a memory cell transistor;
   a second transistor connected to either a drain side or a source side of the second memory cell row and having a longer gate length than that of the first transistor;
   a third memory cell row having at least a memory cell transistor;
   a third transistor connected to either a drain side or a source side of the third memory cell row;
   a fourth memory cell row having at least a memory cell transistor; and
   a fourth transistor connected to either a drain side or a source side of the fourth memory cell row and having a shorter gate length than that of the third transistor, wherein the first and second transistors are connected to either a data line or a source line through a first contact common to both the first and second transistors, and form a first memory cell group, the third and fourth transistors are connected to either a data line or a source line through a second contact common to both the third and fourth transistors, and form a second memory cell group, gate electrodes of the first and third transistors are connected in common to a first gate line, gate electrodes of the second and fourth transistors are connected in common to a second gate line and said first and second memory cell groups are separated from each other such that an element separation region is inserted between said first and second memory cell groups.

16. A semiconductor memory device according to claim 15, wherein the memory cell transistors of the memory cell rows are formed in a structure in which a first conductive layer is formed above a semiconductor substrate with a first insulating film inserted therebetween and a second conductive layer is formed above the first conductive layer with a second insulating film inserted therebetween, and a plurality of the memory cell transistors are connected in parallel or in series, and form at least one selected from the group consisting of a DINOR type non-volatile memory cell, and AND type non-volatile memory cell and a NAND type non-volatile memory cell.

17. A semiconductor memory device according to claim 15, wherein said first contact is arranged on the opposite side of said third transistor with said element separation region inserted therebetween and said second contact is arranged on the opposite side of said second transistor with said element separation region inserted therebetween.

18. A semiconductor memory device according to claim 15, wherein said first and second memory cell groups are arranged side by side each other with the element separation region therebetween.

19. A semiconductor memory device comprising:

first, second, third, and fourth memory cell rows each constituted by connecting a plurality of memory cell transistors formed on a semiconductor substrate, such that the first, second, third, and fourth memory cell rows are provided to form a memory cell array, wherein the first memory cell row is connected to the second memory cell row through a first transistor, the third memory cell row is connected to the fourth memory cell row through a second transistor, the first and second memory cell rows are provided so as to be respectively adjacent to the third and fourth memory cell rows such that element separation regions are respectively inserted between adjacent memory cell rows, gate electrodes of the first and second transistors are connected in common to a first gate line, a first contact to be connected to either a data line or a source line is provided between the first transistor and the first memory cell row, and a second contact to be connected to either a data line a source line is provided between the second transistor and the fourth memory cell row.

20. A semiconductor memory device according to claim 19, wherein the memory cell transistors of the memory cell rows are formed in a structure in which a first conductive layer is formed above a semiconductor substrate with a first insulating film inserted therebetween and a second conductive layer is formed above the first conductive layer with a second insulating film inserted therebetween, and a plurality of the memory cell transistors are connected in parallel or in series, and form at least one selected from the group consisting of a DINOR type non-volatile memory cell, an AND type non-volatile memory cell, and a NAND type non-volatile memory cell.

* * * * *

UNITED STATES PATENT AND TRADEMARK OFFICE
CERTIFICATE OF CORRECTION

PATENT NO. : 6,157,056
DATED : December 5, 2000
INVENTOR(S) : Yuji Takeuchi et al.

Page 1 of 1

It is certified that error appears in the above-identified patent and that said Letters Patent is hereby corrected as shown below:

<u>Column 20, claim 16,</u>
Line 63, "and" has been replace with -- an --.

Signed and Sealed this

Eighteenth Day of December, 2001

Attest:

JAMES E. ROGAN
*Attesting Officer*     *Director of the United States Patent and Trademark Office*